US012584216B2

(12) United States Patent (10) Patent No.: US 12,584,216 B2
Chang et al. (45) Date of Patent: Mar. 24, 2026

(54) MINIMIZING TIN OXIDE CHAMBER CLEAN TIME

(71) Applicant: Lam Research Corporation, Fremont, CA (US)

(72) Inventors: Ching-Yun Chang, West Linn, OR (US); Jeongseok Ha, Portland, OR (US); Pei-Chi Liu, Portland, OR (US)

(73) Assignee: Lam Research Corporation, Fremont, CA (US)

( * ) Notice: Subject to any disclaimer, the term of this patent is extended or adjusted under 35 U.S.C. 154(b) by 145 days.

(21) Appl. No.: 18/556,075

(22) PCT Filed: Apr. 20, 2022

(86) PCT No.: PCT/US2022/025553
§ 371 (c)(1),
(2) Date: Oct. 18, 2023

(87) PCT Pub. No.: WO2022/226074
PCT Pub. Date: Oct. 27, 2022

(65) Prior Publication Data
US 2024/0191350 A1 Jun. 13, 2024

Related U.S. Application Data

(60) Provisional application No. 63/201,279, filed on Apr. 21, 2021.

(51) Int. Cl.
*H01J 37/32* (2006.01)
*C23C 16/44* (2006.01)
*C23C 16/52* (2006.01)
(52) U.S. Cl.
CPC .......... *C23C 16/4405* (2013.01); *C23C 16/52* (2013.01); *H01J 37/32862* (2013.01)

(58) Field of Classification Search
CPC ... C23C 16/4405; C23C 16/52; C23C 16/407; H01J 37/32853; H01J 37/32862
See application file for complete search history.

(56) References Cited

U.S. PATENT DOCUMENTS 4,544,444 A 10/1985 Chang
4,708,766 A 11/1987 Hynecek
(Continued)

FOREIGN PATENT DOCUMENTS

CN 1213708 A 4/1999
CN 1959541 A 5/2007
(Continued)

OTHER PUBLICATIONS

Bespalov I., et al., "Key Role of Very Low Energy Electrons in Tin-Based Molecular Resists for Extreme Ultraviolet Nanolithography," ACS Applied Materials & Interfaces, 2020, vol. 12, pp. 9881-9889.
(Continued)

*Primary Examiner* — Erin F Bergner
(74) *Attorney, Agent, or Firm* — Weaver Austin Villeneuve & Sampson LLP

(57) ABSTRACT

Techniques described herein relate to methods and apparatus for minimizing tin oxide chamber clean time. In many cases, the chamber is a deposition chamber used for depositing tin oxide on semiconductor substrates. The techniques involve exposing the chamber surface to a first plasma generated from a first plasma generation gas including reducing chemistry to reduce the tin oxide to tin, and then exposing the chamber surface to a second plasma generated from a second plasma generation gas including reducing chemistry and organic additive chemistry to remove the tin from the chamber surface. In some cases, the first plasma used to reduce the tin oxide to tin further includes inert gas.

10 Claims, 8 Drawing Sheets

(56) References Cited

U.S. PATENT DOCUMENTS

| | | | |
|---|---|---|---|
| 4,750,980 | A | 6/1988 | Hynecek |
| 4,778,562 | A | 10/1988 | Chang |
| 4,878,993 | A | 11/1989 | Rossi et al. |
| 5,032,221 | A | 7/1991 | Roselle et al. |
| 5,079,178 | A | 1/1992 | Chouan et al. |
| 5,171,401 | A | 12/1992 | Roselle |
| 5,286,337 | A | 2/1994 | Tsou |
| 5,318,664 | A | 6/1994 | Saia et al. |
| 5,399,464 | A | 3/1995 | Lee |
| 5,607,602 | A | 3/1997 | Su et al. |
| 5,667,631 | A | 9/1997 | Holland et al. |
| 5,723,366 | A | 3/1998 | Suzuki et al. |
| 6,036,876 | A | 3/2000 | Chen et al. |
| 6,083,844 | A | 7/2000 | Bui-Le et al. |
| 6,180,438 | B1 | 1/2001 | Deane et al. |
| 6,326,301 | B1 | 12/2001 | Venkatesan et al. |
| 6,368,978 | B1 | 4/2002 | Kumar et al. |
| 6,416,822 | B1 | 7/2002 | Chiang et al. |
| 6,428,859 | B1 | 8/2002 | Chiang et al. |
| 6,617,253 | B1 | 9/2003 | Chu et al. |
| 6,833,306 | B2 | 12/2004 | Lyding et al. |
| 7,459,732 | B2 | 12/2008 | Fleischer et al. |
| 8,163,094 | B1 | 4/2012 | Greer et al. |
| 8,435,608 | B1 | 5/2013 | Subramonium et al. |
| 8,747,964 | B2 | 6/2014 | Park et al. |
| 8,901,016 | B2 | 12/2014 | Ha et al. |
| 8,969,110 | B2 | 3/2015 | Choi |
| 9,269,590 | B2 | 2/2016 | Luere et al. |
| 9,287,113 | B2 | 3/2016 | Kang et al. |
| 9,390,909 | B2 | 7/2016 | Pasquale et al. |
| 9,437,443 | B2 | 9/2016 | Brink et al. |
| 9,515,156 | B2 | 12/2016 | Besser et al. |
| 9,523,148 | B1 | 12/2016 | Pore et al. |
| 9,640,396 | B2 | 5/2017 | Lin et al. |
| 9,824,893 | B1 | 11/2017 | Smith et al. |
| 9,892,917 | B2 | 2/2018 | Swaminathan et al. |
| 9,996,004 | B2 | 6/2018 | Smith et al. |
| 10,546,748 | B2 | 1/2020 | Yu et al. |
| 10,665,501 | B2 | 5/2020 | Rainville et al. |
| 10,672,913 | B2 | 6/2020 | Yamazaki et al. |
| 10,732,505 | B1 | 8/2020 | Meyers et al. |
| 11,031,245 | B2 | 6/2021 | Smith et al. |
| 11,088,019 | B2 | 8/2021 | Van Cleemput et al. |
| 11,183,383 | B2 | 11/2021 | Smith et al. |
| 11,322,351 | B2 | 5/2022 | Yu et al. |
| 11,355,353 | B2 | 6/2022 | Yu et al. |
| 11,358,975 | B2 | 6/2022 | Ermert et al. |
| 11,551,038 | B2 | 1/2023 | Chaudhuri et al. |
| 11,551,938 | B2 | 1/2023 | Heo et al. |
| 11,637,037 | B2 | 4/2023 | Van Cleemput et al. |
| 11,784,047 | B2 | 10/2023 | Smith et al. |
| 11,848,212 | B2 | 12/2023 | Heo et al. |
| 11,987,876 | B2 | 5/2024 | Kanakasabapathy et al. |
| 12,051,589 | B2 | 7/2024 | Smith et al. |
| 12,094,711 | B2 | 9/2024 | Yu et al. |
| 12,112,980 | B2 | 10/2024 | Van Cleemput et al. |
| 12,183,589 | B2 | 12/2024 | Yu et al. |
| 12,293,919 | B2 | 5/2025 | Heo et al. |
| 12,417,916 | B2 | 9/2025 | Yu et al. |
| 12,437,995 | B2 | 10/2025 | Yu et al. |
| 2001/0008227 | A1 | 7/2001 | Sadamoto et al. |
| 2001/0018252 | A1 | 8/2001 | Park et al. |
| 2001/0030860 | A1 | 10/2001 | Kimura et al. |
| 2002/0044230 | A1 | 4/2002 | Yamazaki et al. |
| 2002/0113271 | A1 | 8/2002 | Noguchi et al. |
| 2002/0134425 | A1 | 9/2002 | Yamamoto et al. |
| 2002/0185466 | A1 | 12/2002 | Furuta et al. |
| 2003/0232504 | A1 | 12/2003 | Eppler et al. |
| 2004/0033698 | A1 | 2/2004 | Lee et al. |
| 2005/0112881 | A1 | 5/2005 | Prakash et al. |
| 2005/0153505 | A1 | 7/2005 | Gambino et al. |
| 2005/0167050 | A1 | 8/2005 | Oikawa |
| 2006/0046200 | A1 | 3/2006 | Abatchev et al. |
| 2006/0072084 | A1 | 4/2006 | Van Herpen et al. |
| 2006/0073706 | A1 | 4/2006 | Li et al. |
| 2006/0148118 | A1 | 7/2006 | Hsiung et al. |
| 2006/0175558 | A1 | 8/2006 | Bakker et al. |
| 2006/0270209 | A1 | 11/2006 | Mitsui et al. |
| 2007/0040999 | A1 | 2/2007 | Wilhelmus Van Herpen et al. |
| 2007/0062557 | A1 | 3/2007 | Rakhimova et al. |
| 2007/0069160 | A1 | 3/2007 | Banine et al. |
| 2007/0134938 | A1 | 6/2007 | Kozuka et al. |
| 2008/0061030 | A1 | 3/2008 | Liu et al. |
| 2008/0081483 | A1 | 4/2008 | Wu |
| 2008/0210660 | A1 | 9/2008 | Stockum et al. |
| 2008/0286448 | A1 | 11/2008 | Elam et al. |
| 2008/0286964 | A1 | 11/2008 | Hotta et al. |
| 2009/0011589 | A1 | 1/2009 | Jeon et al. |
| 2009/0017616 | A1 | 1/2009 | Grunow et al. |
| 2009/0145879 | A1 | 6/2009 | Fairbairn et al. |
| 2009/0233425 | A1 | 9/2009 | Furuno et al. |
| 2010/0099046 | A1 | 4/2010 | Kim et al. |
| 2010/0120247 | A1 | 5/2010 | Park |
| 2010/0159639 | A1 | 6/2010 | Sakata |
| 2010/0195033 | A1 | 8/2010 | Takayama et al. |
| 2011/0121378 | A1 | 5/2011 | Ahn et al. |
| 2011/0198627 | A1 | 8/2011 | Maindron et al. |
| 2011/0306214 | A1 | 12/2011 | Zin |
| 2012/0027937 | A1 | 2/2012 | Gordon et al. |
| 2012/0046421 | A1 | 2/2012 | Darling et al. |
| 2012/0115250 | A1 | 5/2012 | Ariga et al. |
| 2012/0193632 | A1 | 8/2012 | Toriumi |
| 2013/0161625 | A1 | 6/2013 | Ku et al. |
| 2013/0273733 | A1 | 10/2013 | Tang et al. |
| 2013/0309871 | A1 | 11/2013 | DeVilliers |
| 2014/0004707 | A1 | 1/2014 | Thedjoisworo et al. |
| 2014/0060574 | A1* | 3/2014 | Wyse .................... B08B 7/00 134/2 |
| 2014/0167040 | A1 | 6/2014 | Lee et al. |
| 2014/0199497 | A1 | 7/2014 | Spurlin et al. |
| 2014/0308812 | A1 | 10/2014 | Arghavani et al. |
| 2014/0367833 | A1 | 12/2014 | Brink et al. |
| 2015/0000737 | A1 | 1/2015 | Miyake et al. |
| 2015/0087151 | A1 | 3/2015 | Huang et al. |
| 2015/0122497 | A1 | 5/2015 | Donaldson |
| 2015/0126042 | A1 | 5/2015 | Pasquale et al. |
| 2015/0140726 | A1 | 5/2015 | Honda et al. |
| 2015/0162416 | A1 | 6/2015 | Chang et al. |
| 2015/0179414 | A1 | 6/2015 | Xiao et al. |
| 2015/0214094 | A1 | 7/2015 | Jezewski et al. |
| 2015/0221541 | A1 | 8/2015 | Nemani et al. |
| 2015/0243661 | A1 | 8/2015 | Matsumoto |
| 2015/0247238 | A1 | 9/2015 | Pasquale et al. |
| 2015/0287612 | A1 | 10/2015 | Luere et al. |
| 2015/0318181 | A1 | 11/2015 | Cantone et al. |
| 2015/0371864 | A1 | 12/2015 | Hsu et al. |
| 2016/0111374 | A1 | 4/2016 | Brink et al. |
| 2016/0111515 | A1 | 4/2016 | Besser et al. |
| 2016/0116839 | A1 | 4/2016 | Meyers et al. |
| 2016/0148818 | A1 | 5/2016 | Dobashi et al. |
| 2016/0195812 | A1 | 7/2016 | Huang et al. |
| 2016/0203982 | A1 | 7/2016 | Lin et al. |
| 2016/0216606 | A1 | 7/2016 | Meyers et al. |
| 2016/0293405 | A1 | 10/2016 | Matsumoto et al. |
| 2016/0293418 | A1 | 10/2016 | Pasquale et al. |
| 2016/0293437 | A1 | 10/2016 | Zhou et al. |
| 2016/0293438 | A1 | 10/2016 | Zhou et al. |
| 2016/0314985 | A1 | 10/2016 | Yang et al. |
| 2016/0329207 | A1 | 11/2016 | Mohanty et al. |
| 2016/0336178 | A1 | 11/2016 | Swaminathan et al. |
| 2016/0358782 | A1 | 12/2016 | Yang et al. |
| 2016/0365425 | A1 | 12/2016 | Chen et al. |
| 2016/0379842 | A1 | 12/2016 | Kal et al. |
| 2017/0022607 | A1 | 1/2017 | Shibusawa |
| 2017/0102612 | A1 | 4/2017 | Meyers et al. |
| 2017/0301552 | A1 | 10/2017 | Devilliers |
| 2018/0012759 | A1 | 1/2018 | Smith et al. |
| 2018/0090335 | A1 | 3/2018 | Karve et al. |
| 2018/0204731 | A1 | 7/2018 | Zhang et al. |
| 2018/0233398 | A1 | 8/2018 | Van Cleemput et al. |
| 2018/0240667 | A1 | 8/2018 | Yu et al. |
| 2018/0277661 | A1 | 9/2018 | Nagayama et al. |
| 2018/0308680 | A1 | 10/2018 | Reddy et al. |
| 2019/0027583 | A1 | 1/2019 | Margetis et al. |

(56)  References Cited

U.S. PATENT DOCUMENTS

| | | | |
|---|---|---|---|
| 2019/0137870 A1 | 5/2019 | Meyers et al. | |
| 2019/0157084 A1 | 5/2019 | Huang et al. | |
| 2019/0237341 A1 | 8/2019 | Yu et al. | |
| 2019/0312147 A1 | 10/2019 | Lee et al. | |
| 2019/0385828 A1* | 12/2019 | Singhal | H01L 21/67109 |
| 2019/0390341 A1 | 12/2019 | Singhal et al. | |
| 2020/0006082 A1 | 1/2020 | Su | |
| 2020/0051807 A1* | 2/2020 | Singhal | H01L 21/31122 |
| 2020/0083044 A1 | 3/2020 | Yu et al. | |
| 2020/0133131 A1 | 4/2020 | Ouyang | |
| 2020/0199751 A1 | 6/2020 | Singhal et al. | |
| 2020/0219725 A1 | 7/2020 | Smith et al. | |
| 2020/0219758 A1 | 7/2020 | Van Cleemput et al. | |
| 2021/0017643 A1 | 1/2021 | Kanakasabapathy et al. | |
| 2021/0242019 A1 | 8/2021 | Smith et al. | |
| 2021/0265163 A1 | 8/2021 | Yu et al. | |
| 2021/0265173 A1 | 8/2021 | Yu et al. | |
| 2021/0343579 A1 | 11/2021 | Van Cleemput et al. | |
| 2022/0005694 A1 | 1/2022 | Smith et al. | |
| 2022/0021099 A1 | 1/2022 | Shrivastava et al. | |
| 2022/0165571 A1 | 5/2022 | Yu et al. | |
| 2022/0189771 A1 | 6/2022 | Lee et al. | |
| 2022/0189786 A1* | 6/2022 | Lin | H01L 21/3081 |
| 2022/0208551 A1 | 6/2022 | Heo et al. | |
| 2022/0270877 A1 | 8/2022 | Yu et al. | |
| 2023/0197459 A1 | 6/2023 | Heo et al. | |
| 2023/0227970 A1 | 7/2023 | Ha et al. | |
| 2023/0238238 A1 | 7/2023 | Singhal et al. | |
| 2024/0030031 A1 | 1/2024 | Smith et al. | |
| 2024/0087904 A1 | 3/2024 | Heo et al. | |
| 2024/0263301 A1 | 8/2024 | Kanakasabapathy et al. | |
| 2024/0302739 A1 | 9/2024 | Kanakasabapathy et al. | |
| 2024/0429091 A1 | 12/2024 | Van Cleemput et al. | |
| 2025/0087498 A1 | 3/2025 | Yu et al. | |
| 2025/0346767 A1 | 11/2025 | Vrtis et al. | |

FOREIGN PATENT DOCUMENTS

| | | | |
|---|---|---|---|
| CN | 101512726 A | 8/2009 | |
| CN | 101681812 A | 3/2010 | |
| CN | 101800174 A | 8/2010 | |
| CN | 103426809 A | 12/2013 | |
| CN | 104701142 A | 6/2015 | |
| CN | 104752199 A | 7/2015 | |
| CN | 107546106 A | 1/2018 | |
| DE | 4337309 A1 | 3/1995 | |
| EP | RD301101 | 5/1989 | |
| JP | S5330798 A | 3/1978 | |
| JP | S62136579 A | 6/1987 | |
| JP | S62179774 A | 8/1987 | |
| JP | S6425420 A | 1/1989 | |
| JP | H01259184 A | 10/1989 | |
| JP | H0298007 A | 4/1990 | |
| JP | H0377209 A | 4/1991 | |
| JP | H03136249 A | 6/1991 | |
| JP | H04506888 A | 11/1992 | |
| JP | H05267701 A | 10/1993 | |
| JP | H06151379 A | 5/1994 | |
| JP | H0781600 A | 3/1995 | |
| JP | H08162443 A | 6/1996 | |
| JP | H09120967 A | 5/1997 | |
| JP | 2644758 B2 | 8/1997 | |
| JP | H1010549 A | 1/1998 | |
| JP | H1081600 A | 3/1998 | |
| JP | H10303176 A | 11/1998 | |
| JP | H11219941 A | 8/1999 | |
| JP | 2001068462 A | 3/2001 | |
| JP | 2003068155 A | 3/2003 | |
| JP | 2005217240 A | 8/2005 | |
| JP | 2007096297 A | 4/2007 | |
| JP | 2007208076 A | 8/2007 | |
| JP | 2013179127 A | 9/2013 | |
| JP | 2013191762 A | 9/2013 | |
| JP | 2014086500 A | 5/2014 | |
| JP | 2015011668 A | 1/2015 | |
| JP | 2015111668 A | 6/2015 | |
| JP | 2015122497 A | 7/2015 | |
| JP | 2016082233 A | 5/2016 | |
| JP | 2016143890 A | 8/2016 | |
| JP | 2017022368 A | 1/2017 | |
| JP | 2018006742 A | 1/2018 | |
| JP | 2018142698 A | 9/2018 | |
| JP | 2020508579 A | 3/2020 | |
| JP | 2020510994 A | 4/2020 | |
| JP | 7483839 B2 | 5/2024 | |
| KR | 950012151 A | 5/1995 | |
| KR | 19990023468 A | 3/1999 | |
| KR | 20030007457 A | 1/2003 | |
| KR | 20040016779 A | 2/2004 | |
| KR | 20070067119 A | 6/2007 | |
| KR | 20070076721 A | 7/2007 | |
| KR | 20090022667 A | 3/2009 | |
| KR | 20120024616 A | 3/2012 | |
| KR | 20120125102 A | 11/2012 | |
| KR | 20130088704 A | 8/2013 | |
| KR | 20150053253 A | 5/2015 | |
| KR | 20160021809 A | 2/2016 | |
| KR | 20160110945 A | 9/2016 | |
| KR | 20170141673 A | 12/2017 | |
| KR | 20180002026 A | 1/2018 | |
| KR | 20210128796 A | 10/2021 | |
| RU | 2053584 C1 | 1/1996 | |
| TW | 134077 | 5/1990 | |
| TW | 328624 B | 3/1998 | |
| TW | 538137 B | 6/2003 | |
| TW | 200531080 A | 9/2005 | |
| TW | 200938660 A | 9/2009 | |
| TW | 201027593 A | 7/2010 | |
| TW | 201410914 A | 3/2014 | |
| TW | 201427084 A | 7/2014 | |
| TW | 201546314 A | 12/2015 | |
| TW | 201626564 A | 7/2016 | |
| TW | 201812834 A | 4/2018 | |
| TW | 202002076 A | 1/2020 | |
| TW | 202022922 A | 6/2020 | |
| WO | WO-9859379 A1 | 12/1998 | |
| WO | WO-2010134176 A1 | 11/2010 | |
| WO | WO-2014010310 A1 | 1/2014 | |
| WO | WO-2019152362 A1 | 8/2019 | |
| WO | WO-2019199467 A1 | 10/2019 | |
| WO | WO-2019216092 A1 | 11/2019 | |
| WO | WO-2019217749 A1 | 11/2019 | |
| WO | WO-2020005487 A1 | 1/2020 | |
| WO | WO-2020033602 A1 | 2/2020 | |
| WO | WO-2020263757 A1 | 12/2020 | |

OTHER PUBLICATIONS

Cardineau, B. et al., "EUV Resists Based on Tin-oxo Clusters", Advances in Patterning Materials and Processes XXXI, Proceedings Of Spie, Apr. 4, 2014, vol. 9051, pp. 335-346.

Chiang C L., et al., "Secondary Electron Emission Characteristics of Oxide Electrodes In Flat Electron Emission Lamp," AIP Advances, 2016, vol. 6, 015317, 9 Pages.

Chinese First Office Action dated Jan. 6, 2020 issued in Application No. CN 201710498301.5.

Chinese Second Office Action dated Jun. 15, 2020 issued in Application No. CN 201710498301.5.

Choi W.S., "The Fabrication of Tin Oxide Films by Atomic Layer Deposition using Tetrakis(Ethylmethylamino) Tin Precursor," Transactions on Electrical and Electronic Materials, Dec. 2009, vol. 10(6), pp. 200-202.

CN Office Action dated Jun. 4, 2024 in CN Application No. 202010517239.1 with English translation.

CN Office Action dated Jun. 17, 2024 in CN Application No. 202110728563.2, with English Translation.

CN Office Action dated Jun. 17, 2024 in CN Application No. 202110746345.1, with English Translation.

CN Office Action dated Jun. 24, 2024 in CN Application No. 201980010832.2 with English translation.

CN Office Action dated Jun. 27, 2024 in CN Application No. 201980020786.4 with English translation.

(56) References Cited

OTHER PUBLICATIONS

CN Office Action dated Jun. 28, 2024 in CN Application No. 202011403430.X with English translation.
CN Office Action dated Mar. 13, 2024 in CN Application No. 202010909034.8, with EnglishTranslation.
CN Office Action dated Mar. 27, 2023, in Application No. CN201880023914.6 with English translation.
CN Office Action dated Mar. 29, 2023, in Application No. CN201810148464.5 with English translation.
Cui L F., et al., "Endohedral Stannaspherenes M@Sn12: A Rich Class of Stable Molecular Cage Clusters," Endohedral Tin Cages, 2007, vol. 46, pp. 742-745.
Du X., et al., "In Situ Examination of Tin Oxide Atomic Layer Deposition Using Quartz Crystal Microbalance and Fourier Transform Infrared Techniques," Journal of Vacuum Science & Technology, 2005, vol. 23(4), pp. 581-588.
Elam J.W., et al., "Atomic Layer Deposition of Indium Tin Oxide Thin Films Using Nonhalogenated Precursors," Journal of Physical Chemistry C, 2008, vol. 112(6), pp. 1938-1945.
Elam, J.W., et al., "Atomic Layer Deposition of Tin Oxide Films using Tetrakis(Dimethylamino) Tin," Journal of Vacuum Science & Technology, 2008, vol. 26, No. 2, pp. 244-252.
Fitzgerald C B., et al., "Magnetism in Dilute Magnetic Oxide Thin Films Based on SnO2," The American Physical Society, 2006, vol. 74, 115307, 10 Pages.
Gordon R.G., et al., "Low-Temperature Atmospheric Pressure Chemical Vapor Deposition of Polycrystalline Tin Nitride Thin Films," Chemistry of Materials, 1992, vol. 4, pp. 68-71.
Heo J., et al., "Atomic Layer Deposition of Tin Oxide with Nitric Oxide as an Oxidant Gas," Journals of Materials Chemistry, 2012, vol. 22, pp. 4599-4602.
Heo, J. et al., "Low Temperature Atomic Layer Deposition of Tin Oxide," Chemistry of Materials, 2010, vol. 22, No. 17, pp. 4964-4973.
International Search Report and Written Opinion dated May 18, 2022, in International Application No. PCT/US2022/014984.
International Preliminary Report and Patentability (ISA/KR) dated Oct. 1, 2020 issued in Application No. PCT/US2019/022319.
International Preliminary Report on Patentability dated Aug. 13, 2020 issued in Application No. PCT/US2019/015559.
International Preliminary Report on Patentability dated Aug. 24, 2023, in PCT Application No. PCT/US2022/014984.
International Preliminary Report on Patentability dated Aug. 29, 2019 issued in Application No. PCT/US2018/018019.
International Preliminary Report on Patentability dated Dec. 29, 2022, in PCT Application No. PCT/US2021/036763.
International Preliminary Report on Patentability dated Feb. 2, 2023, in PCT Application No. PCT/US2021/042626.
International Preliminary Report on Patentability dated Jan. 6, 2022 in PCT Application No. PCT/US2020/038996.
International Preliminary Report on Patentability dated Nov. 2, 2023 in Application No. PCT/US2022/025553.
International Search Report and Written Opinion dated Jul. 28, 2022 in Application No. PCT/US2022/025553.
International Search Report and Written Opinion dated Nov. 11, 2021, in PCT Application No. PCT/US2021/042626.
International Search Report and Written Opinion dated Oct. 1, 2021, in PCT Application No. PCT/US2021/036763.
International Search Report and Written Opinion dated Oct. 5, 2020, in application No. PCT/US2020/038996.
International Search Report and Written Opinion (ISA/KR) dated Jul. 3, 2019 issued in Application No. PCT/US2019/022319.
International Search Report and Written Opinion (ISA/KR) dated Jun. 27, 2018 issued in Application No. PCT/US18/18019.
International Search Report and Written Opinion (ISA/KR) dated May 17, 2019 issued in Application No. PCT/US2019/015559.
Jalife S., et al., "Noble Gas Endohedral Fullerenes," Chemical Science, 2020, vol. 11, pp. 6642-6652.
Japanese First Office Action dated Aug. 3, 2021 issued in Application No. JP 2017-120945.

Japanese Journal of Applied Physics, vol. 27, No. 9, Sep. 1988, T. Minami et al.: "Reactive ion etching of transparent conducting tin oxide films using electron cyclotron resonance hydrogen plasma", pp. L 1753-L 1756 (Year: 1988).
JP Office Action dated Nov. 1, 2022, in Application No. JP2019-543306 with English translation.
JP Office Action dated Dec. 19, 2023, in JP Application No. 2022-194568 with English translation.
JP Office Action dated Feb. 1, 2022, in Application No. JP2018-021500 with English translation.
JP Office Action dated Jan. 24, 2023 in Application No. JP2020-540611 with English translation.
JP Office Action dated Jan. 30, 2024 in JP Application No. 2022-154384, with English Translation.
JP Office Action dated Jul. 18, 2023 in Application No. JP2022-93370 with English Translation.
JP Office Action dated Mar. 29, 2022, in Application No. JP2019-543306 with English translation.
JP Office Action dated May 10, 2022, in Application No. JP2017-120945 with English translation.
JP Office Action dated Sep. 5, 2023, in Application No. JP2022-154384 with English translation.
JP06151379A (translation) (Year: 1994).
Komen C V., et al., "Structure-Magnetic Property Relationship Intransition Metal (M=V,Cr, Mn, Fe, Co, Ni) Doped Sno2 Nanoparticles," Journal of Applied Physics, 2008, vol. 103, 5 Pages.
Korean First Office Action dated Aug. 18, 2021 issued in Application No. KR 10-2017-0077686.
Korean First Office Action dated Jul. 30, 2021 issued in Application No. KR 10-2021-7017077.
KR Office Action dated Aug. 30, 2022 in Application No. KR10-2020-7024840 With English translation.
KR Office Action dated Jul. 18, 2022 in Application No. KR10-2021-7017077 With English translation.
KR Office Action dated Jun. 8, 2022, in Application No. KR1020200034960 with English translation.
KR Office action dated Apr. 20, 2022, in Application No. KR10-2019-7026772 with English translation.
KR Office Action dated Aug. 18, 2021, in application No. KR1020200034960.
KR Office Action dated Dec. 21, 2023 in KR Application No. 10-2020-7029725 with English translation.
KR Office Action dated Feb. 17, 2022, in Application No. KR10-2021-7017077 with English translation.
KR Office Action dated Jan. 17, 2024 in KR Application No. 10-2023-0062221 with English translation.
KR Office Action dated Jan. 30, 2023 in Application No. KR10-2019-7026772 with English translation.
KR Office Action dated Mar. 29, 2022, in Application No. KR1020170077686 with English translation.
KR Office Action dated Mar. 29, 2022, in Application No. KR1020200034960 with English translation.
KR Office Action dated Mar. 30, 2023, in Application No. KR10-2020-7024840 With English translation.
KR Office Action dated Mar. 30, 2023, in Application No. KR10-2022-7032676 with English translation.
KR Office Action dated May 14, 2023, in Application No. KR10-2021-7017290 with English translation.
KR Office Action dated Nov. 20, 2022, in Application No. KR10-2018-0014921 with English translation.
KR Office Action dated Nov. 20, 2022, in Application No. KR10-2020-0034961 with English translation.
KR Office Action dated Nov. 24, 2023 in KR Application No. 10-2018-0014921 with English Translation.
KR Office Action dated Nov. 24, 2023 in KR Application No. KR10-2020-0034961 with English Translation.
KR Office Action dated Sep. 18, 2023, in Application No. KR10-2022-7003106 with English translation.
Kvon V., et al., "Secondary Electron Emission Of Tin And Tin-Lithium Under Low Energy Helium Plasma Exposure," Nuclear Materials and Energy, 2017, vol. 13, pp. 21-27.

(56)                    References Cited

OTHER PUBLICATIONS

Kwon K.H., et al., "Etch Mechanism of $In_2O_3$ and $SnO_2$ Thin Films in HBr-Based Inductively Coupled Plasmas," Journal of Vacuum Science and Technology A, 2010, vol. 28(2), pp. 226-231.

Li X., et al., "Tin Oxide with Controlled Morphology and Crystallinity by Atomic Layer Deposition onto Graphene Nanosheets for Enhanced Lithium Storage," Advanced Function Materials, 2012, vol. 22, pp. 1647-1654.

Lin Y., et al., "A New Examination Of Secondary Electron Yield Data," Surface And Interface Analysis, 2005, vol. 37, pp. 895-900.

Mohri M., et al., "Plasma Etching of ITO Thin Films Using a CH4/H2 Gas Mixture," Japanese Journal of Applied Physics, 1990, vol. 29(10), pp. 1932-1935.

Mullings M.N., et al., "Tin Oxide Atomic Layer Deposition from Tetrakis(Dimethylamino) Tin and Water," Journal of Vacuum Science & Technology A, 2013, vol. 31(6), 8 pages.

Notice of Allowance dated Nov. 16, 2021, in U.S. Appl. No. 16/687,142.

Notice of Allowance dated Oct. 27, 2021, in U.S. Appl. No. 16/825,514.

Ogale S B., et al., "High Temperature Ferromagnetism with Giant Magnetic Moment in Transparent Co-doped SnO2-δ," Physical Review Letters, 2003, 17 Pages.

Pedersen A., et al., "Lithiation of Tin Oxide: A Computational Study," Integrated Systems Laboratory, 2014, 20 Pages.

Saunders M., et al., "Noble Gas Atoms Inside Fullerenes," Science, 1996, vol. 271, pp. 1693-1697.

Singh R ., "Unexpected Magnetism In Nanomaterials," Journal of Magnetism and Magnetic Materials, 2013, vol. 346, pp. 58-73.

Taiwanese First Office Action dated Dec. 2, 2020 issued in Application No. TW 106121182.

Taiwanese First Office Action dated Jun. 17, 2021 issued in Application No. TW 107104861.

Taiwanese Second Office Action dated Jul. 20, 2021 issued in Application No. TW 106121182.

Tian Y F., et al., "Oxide Magnetic Semiconductors: Materials, Properties, And Devices," Magnetism, Magnetic Materials, And Interdisciplinary Research, 2013, vol. 22(8), 2 Pages.

TW Office Action dated Dec. 30, 2021, in application No. 110121421 with English translation.

TW Office Action dated Nov. 17, 2022, in Application No. TW107104861 with English Translation.

TW Office Action dated Apr. 27, 2022, in Application No. TW107105182 with English translation.

TW Office Action dated Aug. 27, 2021, in Application No. TW110121421 with English translation.

TW Office Action dated Mar. 2, 2023, in Application No. 110121421 with English translation.

TW Office Action dated Mar. 2, 2023, in Application No. TW107105182 with English translation.

TW Office Action dated Mar. 20, 2023, in Application No. TW107105182 with English translation.

TW Office Action dated Nov. 15, 2023, in TW Application No. TW112117869 with English Translation.

TW Office Action dated Oct. 31, 2023, in TW Application No. TW109121292 with English Translation.

TW Office Action dated Sep. 23, 2022 In Application No. TW111123354 with English translation.

TW Office Action dated Sep. 7, 2021, in TW Application No. TW107105182 with English translation.

TW Rejection Decision dated Oct. 21, 2021, in application No. TW107104861 with English translation.

U.S. Advisory Action dated Jan. 19, 2024 in U.S. Appl. No. 17/302,847.

US Corrected Notice of Allowability dated Dec. 1, 2021, in U.S. Appl. No. 16/687,142.

U.S. Corrected Notice of Allowance dated Feb. 16, 2022 in U.S. Appl. No. 16/260,764.

U.S. Corrected Notice of Allowance dated Feb. 22, 2022 in U.S. Appl. No. 16/687,142.

U.S. Corrected Notice of Allowance dated Mar. 17, 2022 in U.S. Appl. No. 16/687,142.

U.S. Corrected Notice of Allowance dated May 6, 2022 in U.S. Appl. No. 16/260,764.

U.S. Corrected Notice of Allowance dated Nov. 25, 2022 in U.S. Appl. No. 17/596,921.

U.S. Final Office Action dated Apr. 2, 2024 in U.S. Appl. No. 17/302,850.

US Final Office Action, dated Apr. 16, 2020, issued in U.S. Appl. No. 15/713,377.

U.S. Final Office Action dated Dec. 7, 2023 in U.S. Appl. No. 16/982,489.

US Final Office Action, dated Dec. 15, 2020, issued in U.S. Appl. No. 15/893,458.

US Final Office Action, dated Dec. 7, 2020 issued in U.S. Appl. No. 16/260,764.

U.S. Final Office Action dated Feb. 17, 2022 in U.S. Appl. No. 16/825,473.

US Final Office Action, dated Mar. 19, 2020, issued in U.S. Appl. No. 15/893,458.

U.S. Final Office Action dated May 16, 2024 in U.S. Appl. No. 17/650,550.

U.S. Final Office Action dated Oct. 23, 2023 in U.S. Appl. No. 17/302,847.

U.S. Non Final Office Action dated Aug. 15, 2022 in U.S. Appl. No. 17/302,044.

U.S. Non-Final Office Action dated Dec. 11, 2023 in U.S. Appl. No. 17/448,284.

U.S. Non-Final Office Action dated Feb. 1, 2024 in U.S. Appl. No. 17/302,847.

U.S. Non-Final Office Action dated Feb. 13, 2023 in U.S. Appl. No. 17/302,847.

U.S. Non-Final Office Action dated May 5, 2023 in U.S. Appl. No. 18/056,468.

U.S. Non-Final Office Action dated May 28, 2024 in U.S. Appl. No. 18/505,043.

U.S. Non-Final Office Action dated Oct. 3, 2023, in U.S. Appl. No. 17/650,550.

U.S. Non-Final Office Action dated Sep. 7, 2023, in U.S. Appl. No. 16/982,489.

U.S. Non-Final Office Action dated Sep. 22, 2023, in U.S. Appl. No. 17/302,850.

US Notice of Allowance dated Apr. 2, 2021 issued in U.S. Appl. No. 15/893,458.

U.S. Notice of Allowance dated Apr. 4, 2022, in U.S. Appl. No. 16/687,142.

U.S. Notice of Allowance dated Aug. 14, 2023, in U.S. Appl. No. 18/056,468.

US Notice of Allowance, dated Aug. 21, 2019, issued in U.S. Appl. No. 15/894,635.

U.S. Notice of Allowance dated Aug. 23, 2022 in U.S. Appl. No. 17/596,921.

U.S. Notice of Allowance dated Dec. 14, 2022 in U.S. Appl. No. 16/825,473.

U.S. Notice of Allowance dated Feb. 2, 2022 in U.S. Appl. No. 16/260,764.

U.S. Notice of Allowance dated Feb. 27, 2023 in U.S. Appl. No. 16/825,473.

U.S. Notice of Allowance dated Feb. 28, 2024 in U.S. Appl. No. 16/982,489.

US Notice of Allowance dated Jan. 26, 2021 issued in U.S. Appl. No. 15/713,377.

U.S. Notice of Allowance dated Jun. 3, 2024 in U.S. Appl. No. 17/304,697.

U.S. Notice of Allowance dated Jun. 5, 2023, in U.S. Appl. No. 17/302,044.

US Notice of Allowance dated Jun. 23, 2021 issued in U.S. Appl. No. 16/825,514.

US Notice of Allowance, dated Jun. 26, 2017, issued in U.S. Appl. No. 15/195,348.

U.S. Notice of Allowance dated Mar. 16, 2023 in U.S. Appl. No. 16/825,473.

(56)        References Cited

OTHER PUBLICATIONS

U.S. Notice of Allowance dated Mar. 26, 2024 in U.S. Appl. No. 16/982,489.
U.S. Notice of Allowance dated Mar. 28, 2024 in U.S. Appl. No. 17/448,284.
U.S. Notice of Allowance dated May 10, 2024 in U.S. Appl. No. 17/650,551.
U.S. Notice of Allowance dated May 11, 2022, in U.S. Appl. No. 17/596,921.
US Office Action, dated Apr. 11, 2019, issued in U.S. Appl. No. 15/894,635.
US Office Action, dated Aug. 3, 2020, issued in U.S. Appl. No. 15/893,458.
US Office Action, dated Dec. 26, 2019, issued in U.S. Appl. No. 15/713,377.
US Office Action, dated Feb. 9, 2017, issued in U.S. Appl. No. 15/195,348.
US Office Action dated Jun. 24, 2021 issued in U.S. Appl. No. 16/825,473.
US Office Action, dated Jun. 25, 2020, issued in U.S. Appl. No. 16/260,764.
US Office Action, dated Mar. 30, 2021, issued in U.S. Appl. No. 16/687,142.
US Office Action dated Oct. 22, 2021 issued in U.S. Appl. No. 16/825,473.
US Office Action, dated Sep. 13, 2019, issued in U.S. Appl. No. 15/893,458.
US Office Action, dated Sep. 14, 2020, issued in U.S. Appl. No. 15/713,377.
US Office Action, dated Sep. 27, 2021 issued in U.S. Appl. No. 16/260,764.
US Office Action Interview Summary, dated Mar. 11, 2021, issued in U.S. Appl. No. 15/893,458.
U.S. Appl. No. 18/264,391, inventors Kanakasabapathy S K, et al., filed on Aug. 4, 2023.
U.S. Appl. No. 18/634,426, inventors Kanakasabapathy S, et al., filed on Apr. 12, 2024.
U.S. Restriction Requirement dated Apr. 14, 2023 in U.S. Appl. No. 17/302,850.
U.S. Restriction Requirement dated Mar. 17, 2022, in U.S. Appl. No. 17/302,044.
U.S. Restriction Requirement dated Mar. 28, 2024 in U.S. Appl. No. 17/650,551.
U.S. Restriction requirement dated May 25, 2023, in U.S. Appl. No. 17/650,550.
U.S Restriction requirement dated Sep. 26, 2023 in U.S. Appl. No. 17/304,697.
U.S. Supplemental Notice of Allowance dated Dec. 22, 2022 in U.S. Appl. No. 16/825,473.
Wolf S., et al., "Silicon Processing for the VLSI Era," Process Technology, 1986, vol. 1, 16 pages.
Wu B.R., et al., "Texture-Etched $SnO_2$ Glasses Applied to Silicon Thin-Film Solar Cells," Journal of Nanomaterials, 2014, vol. 2014, 9 pages.
CN Office Action dated Jan. 23, 2025 in CN Application No. 202011403430.X, with English Translation.
CN Office Action dated Jun. 28, 2025 in CN Application No. 202110746345.1, with English Translation.
CN Office Action dated Mar. 18, 2025 in CN Application No. 202110746345.1, with English Translation.
CN Office Action dated Mar. 31, 2025 in CN Application No. 201980020786.4, with English Translation.
CN Office Action dated Oct. 17, 2024 in CN Application No. 202010517239.1 with English translation.
International Preliminary Report on Patentability and Written Opinion dated Dec. 26, 2024 in PCT Application No. PCT/US2023/068419.
International Search Report and Written Opinion dated Oct. 6, 2023 in PCT Application No. PCT/US2023/068419.

JP Office Action dated Aug. 13, 2024 in JP Application No. 2023-118733 with English translation.
JP Office Action dated Dec. 17, 2024 in JP Application No. 2022-575705, with English Translation.
JP Office Action dated Feb. 12, 2025 in JP Application No. 2023-222187, with English Translation.
JP Office Action dated Mar. 4, 2025 in JP Application No. 2022-581339, with English Translation.
KR Notice of Allowances dated Jul. 28, 2024, in KR Application No. 10-2018-0014921 with English Translation.
KR Notice of Allowances dated Jul. 28, 2024, in KR Application No. 10-2020-0034961 with English Translation.
KR Office Action dated Nov. 22, 2024 in KR Application No. 10-2024-0147701, with English Translation.
KR Office Action dated Oct. 17, 2025 in KR Application No. 10-2022-7045580, with English Translation.
KR Office Action dated Oct. 27, 2025 in KR Application No. 10-2023-7028523, with English Translation.
KR Office Action dated Oct. 30, 2024 in KR Application No. 10-2023-0062221, with English Translation.
KR Office Action dated Sep. 27, 2024 in KR Application No. 10-2020-7029725, with English Translation.
TW Office Action dated Jul. 21, 2025 in TW Application No. 110126945, with English Translation.
TW Office Action dated Nov. 11, 2024 in TW Application No. 110126945 with English translation.
TW Office Action dated Nov. 21, 2024 in TW Application No. 110120735, with English Translation.
U.S. Corrected Notice of Allowance dated Jul. 2, 2025 in U.S. Appl. No. 17/650,550.
U.S. Final Office Action dated Jun. 3, 2025 in U.S. Appl. No. 18/482,197.
U.S. Final Office Action dated Mar. 6, 2025 in U.S. Appl. No. 17/302,850.
U.S. Final Office Action dated May 1, 2025 in U.S. Appl. No. 18/001,590.
U.S. Final Office Action dated Oct. 18, 2024 in U.S. Appl. No. 18/505,043.
U.S. Final Office Action dated Sep. 10, 2025 in U.S. Appl. No. 18/634,426.
US Non-Final Office Action dated Apr. 30, 2025 in U.S. Appl. No. 18/002,627.
U.S. Non-Final Office Action dated Dec. 5, 2024 in U.S. Appl. No. 17/650,550.
U.S. Non-Final Office Action dated Jan. 13, 2025 in U.S. Appl. No. 18/001,590.
US Non-Final Office Action dated May 20, 2025 in U.S. Appl. No. 18/634,426.
U.S. Non-Final Office Action dated Sep. 27, 2024 in U.S. Appl. No. 17/302,850.
U.S. Non-Final Office Action dated Sep. 30, 2024 in U.S. Appl. No. 18/482,197.
U.S. Notice of Allowance dated Aug. 26, 2024 in U.S. Appl. No. 17/302,847.
U.S. Notice of Allowance dated Jan. 8, 2025 in U.S. Appl. No. 18/505,043.
U.S. Notice of Allowance dated Jun. 11, 2025 in U.S. Appl. No. 17/650,550.
U.S. Notice of Allowance dated May 20, 2025 in U.S. Appl. No. 17/302,850.
U.S. Appl. No. 18/869,622, inventors Vrtis R.N et al., filed Nov. 26, 2024.
U.S. Restriction Requirement dated Oct. 31, 2024 in U.S. Appl. No. 18/001,590.
TW Office Action and Search Report dated Nov. 17, 2025 in TW Application No. 111114930, with English Translation.
U.S. Non-Final Office Action dated Nov. 6, 2025 in U.S. Appl. No. 18/001,590.

* cited by examiner

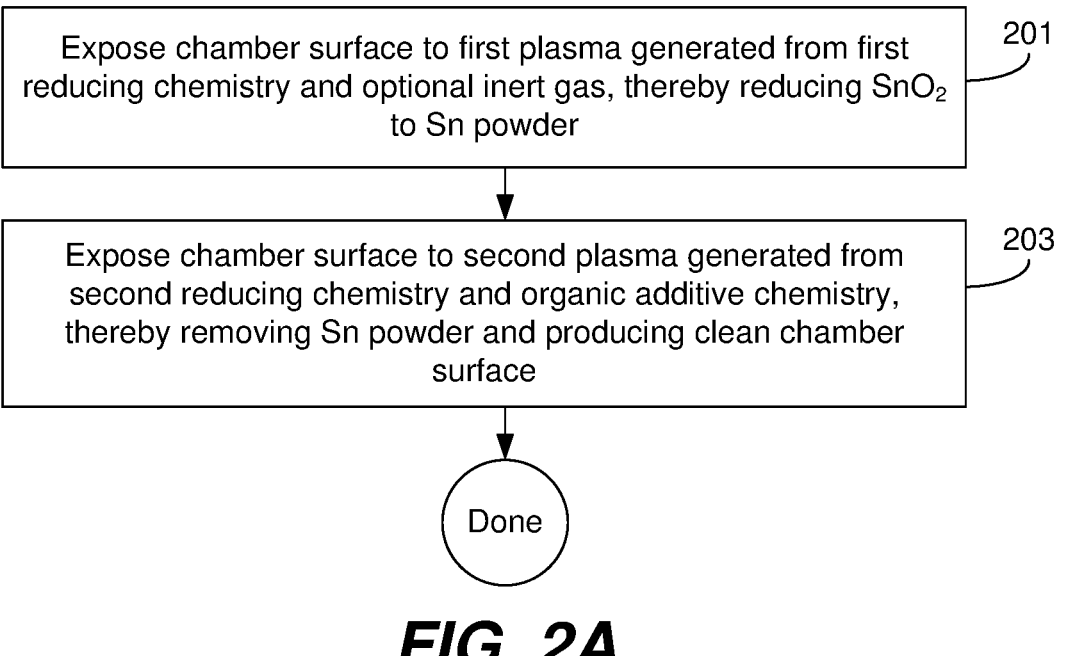

Expose chamber surface to first plasma generated from first reducing chemistry and optional inert gas, thereby reducing $SnO_2$ to Sn powder — 201

Expose chamber surface to second plasma generated from second reducing chemistry and organic additive chemistry, thereby removing Sn powder and producing clean chamber surface — 203

Done

FIG. 2A

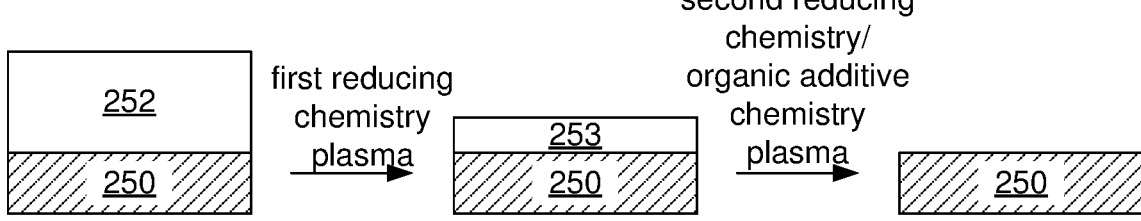

252

250 first reducing chemistry plasma

253

250 second reducing chemistry/ organic additive chemistry plasma

MINIMIZING TIN OXIDE CHAMBER CLEAN TIME

INCORPORATION BY REFERENCE

A PCT Request Form is filed concurrently with this specification as part of the present application. Each application that the present application claims benefit of or priority to as identified in the concurrently filed PCT Request Form is incorporated by reference herein in their entireties and for all purposes.

BACKGROUND

Fabrication of semiconductor devices involves a combination of various processes such as deposition, lithography, etching, etc. A number of different materials are used for several different purposes. One material that may be used is tin oxide.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Various embodiments herein relate to methods, apparatus, and systems for cleaning a chamber surface to remove tin oxide therefrom. In many cases, the chamber surface is an interior surface of a deposition chamber used to deposit tin oxide on semiconductor substrates, though the embodiments are not so limited.

In one aspect of the disclosed embodiments, a method of cleaning a chamber surface to remove tin oxide therefrom is provided, the method including: exposing the chamber surface to a first plasma generated from a first plasma generation gas including a first reducing chemistry to reduce the tin oxide to tin powder; and exposing the chamber surface to a second plasma generated from a second plasma generation gas including a second reducing chemistry and organic additive chemistry to remove the tin powder from the chamber surface.

In certain embodiments, particular chemistries may be used. For instance, in various embodiments, the first reducing chemistry and/or the second reducing chemistry may include at least one species selected from the group consisting of elemental hydrogen ($H_2$) and ammonia ($NH_3$). In these or other embodiments, the organic additive chemistry may include at least one species selected from the group consisting of methane ($CH_4$), ethane ($C_2H_6$), methanol ($CH_3OH$), and ethanol ($C_2H_5OH$). In many cases, the first plasma generation gas may be substantially free of $CH_4$. Further, in various embodiments the first plasma generation gas is substantially free of carbon-containing species. In these or other embodiments, the first plasma generation gas may further include an inert gas. The inert gas may include at least one gas selected from the group consisting of helium, neon, argon, xenon, and nitrogen ($N_2$). In some cases, the first plasma generation gas may have a composition that is about 5% to about 50% inert gas. In these or other embodiments, a ratio of reducing chemistry:organic additive chemistry in the second plasma generation gas may be about 0.01 to about 100. For instance, the ratio of reducing chemistry:

organic additive chemistry in the second plasma generation gas may be about 0.5 to about 20.

In some cases, particular rates of conversion and/or removal may be achieved. In some embodiments, while the chamber surface is exposed to the first plasma, a rate of conversion of the tin oxide to the tin powder is at least about 60 Å/min. In some such embodiments, the rate of conversion of the tin oxide to the tin powder is at least about 300 Å/min. In these or other embodiments, over the course of exposing the chamber surface to the first and second plasmas, the tin oxide may be removed from the chamber surface at a rate of at least about 120 Å/min. In some embodiments, while the chamber surface is exposed to the first plasma, a rate of conversion of the tin oxide to the tin powder does not vary by more than about 10% between different portions of the chamber surface.

In various embodiments, the first and second plasmas are each capacitively coupled plasmas. The chamber surface being cleaned may include a wall, ceiling, and/or floor of a deposition chamber used to deposit tin oxide on a semiconductor substrate.

In another aspect of the disclosed embodiments, an apparatus for processing a substrate is provided, the apparatus including: a processing chamber having a chamber surface on an interior of the processing chamber; an inlet to the processing chamber for introducing reactants to the processing chamber; an outlet to the processing chamber for removing species from the processing chamber; a plasma generator configured to provide plasma in the processing chamber; and a controller configured to cause: exposing the chamber surface to a first plasma generated from a first plasma generation gas including a first reducing chemistry to reduce tin oxide on the chamber surface to tin powder, and exposing the chamber surface to a second plasma generated from a second plasma generation gas including a second reducing chemistry and an organic additive chemistry to remove the tin powder from the chamber surface.

In various implementations, the plasma generator may be a capacitively coupled plasma generator. In these or other embodiments, the first reducing chemistry and/or the second reducing chemistry may include at least one species selected from the group consisting of elemental hydrogen ($H_2$) and ammonia ($NH_3$). In these or other embodiments, the organic additive chemistry may include at least one species selected from the group consisting of methane ($CH_4$), ethane ($C_2H_6$), methanol ($CH_3OH$), and ethanol ($C_2H_5OH$). In some embodiments, the first plasma generation gas is substantially free of carbon-containing species. In a number of embodiments, the first plasma generation gas further includes inert gas.

In some implementations, a ratio of reducing chemistry: organic additive chemistry in the second plasma generation gas may be about 0.5 to about 20. In these or other embodiments, the tin oxide may be converted to tin powder at a rate of at least about 60 Å/min.

These and other aspects are described further below with reference to the drawings.

BRIEF DESCRIPTION OF THE DRAWINGS

FIG. 2A is a flowchart describing a method of cleaning tin oxide from interior surfaces of a processing chamber according to various embodiments.

FIG. 2B illustrates an interior surface of a processing chamber as it undergoes the cleaning steps described in FIG. 2A.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

One material of importance in the fabrication of semiconductor devices is tin oxide. As used herein, tin oxide is intended to refer to stoichiometric and non-stoichiometric forms of $SnO_2$. Additional elements such as hydrogen, carbon, and/or nitrogen may be present in the tin oxide in certain cases. In many cases, tin oxide is deposited through vapor-based techniques such as chemical vapor deposition, atomic layer deposition, physical vapor deposition, etc. Such deposition typically occurs in a processing chamber such as a deposition chamber. Example deposition chambers include, but are not limited to, those in the Striker® product family and in the Vector® product family, each available from Lam Research Corporation of Fremont, CA.

Over the course of deposition, tin oxide (and other materials, if present) can build up on the walls and other surfaces of the processing chamber. If not periodically removed, this material can cause substantial processing problems and associated low quality results. For example, once the material is sufficiently thick, it can begin to peel off the chamber walls and other surfaces, which is not desirable. Further, if the material is not adequately cleaned, it can lead to the formation of substantial particle defects on the substrates being processed in the chamber. Periodically cleaning the chamber helps avoid these problems. Moreover, periodic cleaning improves the life expectancy of the chamber, thereby minimizing capital costs over time.

Various embodiments herein relate to methods and apparatus for cleaning tin oxide from walls and other interior surfaces within a processing chamber. Many of the embodiments herein are presented in the context of cleaning a deposition reactor used to deposit tin oxide on one or more semiconductor substrates. However, the embodiments are not so limited. The techniques described herein may be used to remove tin oxide from walls and other interior surfaces of any type of processing chamber in which plasma can be provided.

Figure 1A:
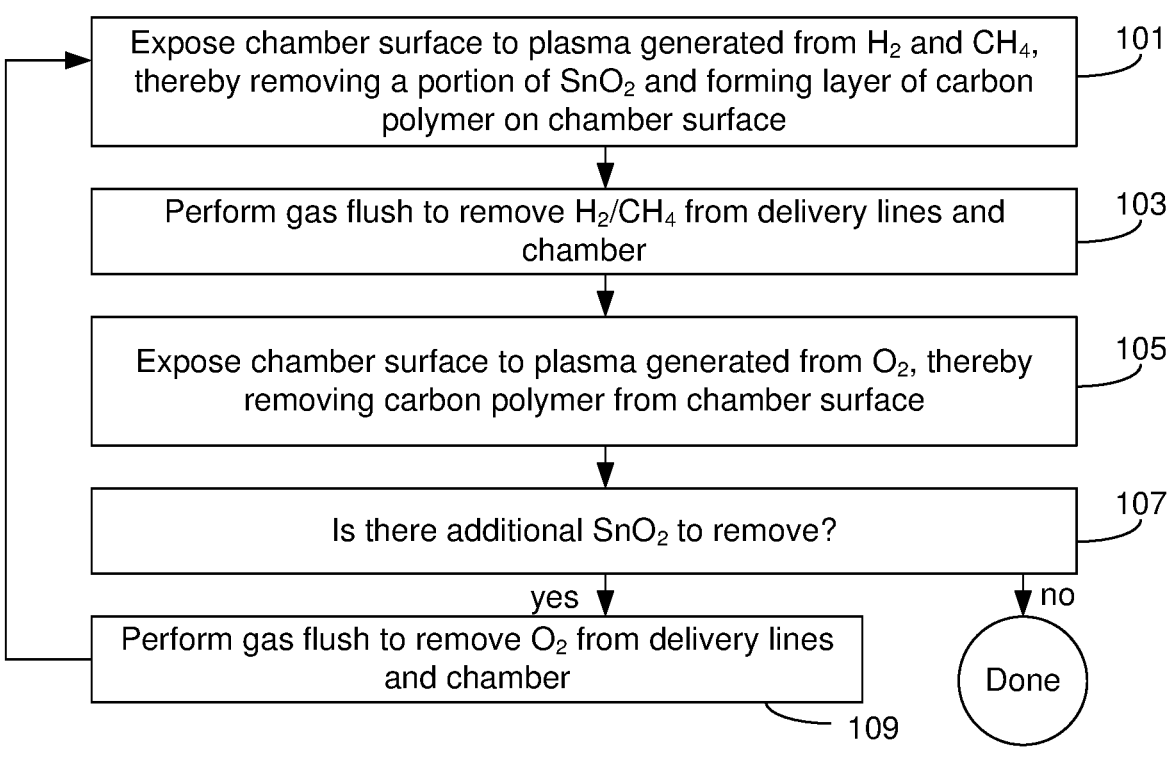
FIG. 1A is a flowchart describing a method of cleaning tin oxide from interior surfaces of a processing chamber.
Figure 1B:
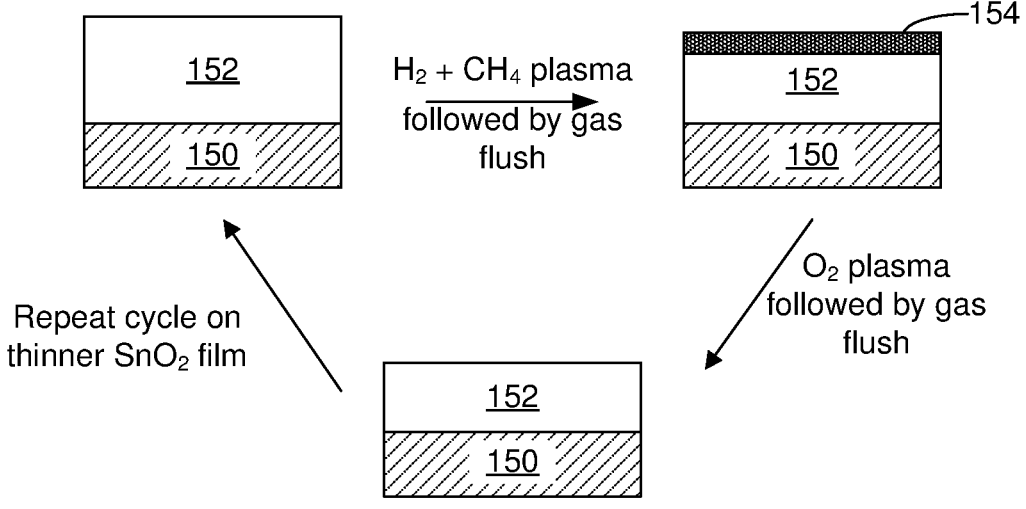
FIG. 1B depicts an interior surface of a processing chamber as it undergoes the cleaning steps described in FIG. 1A.

FIG. 1A presents a flowchart for a method of cleaning tin oxide from an interior surface of a processing chamber. The method of FIG. TA is described with reference to FIG. 1B, which shows chamber surface 150 coated with tin oxide 152 over the course of cleaning. In many cases, the tin oxide 152 has a thickness of about 2 μm on one or more chamber surface 150 before it is removed. In some cases, the tin oxide 152 may have a greater thickness, for example up to about 4 or 5 m in certain embodiments. The method of FIG. TA begins with operation 101, where the chamber surface 150 is exposed to plasma generated from hydrogen ($H_2$) and methane ($CH_4$). As shown in FIG. 1B, this plasma exposure removes a portion of the tin oxide 152 from the chamber surface 150. However, while the tin oxide 152 is being removed, a layer of carbon polymer 154 is simultaneously formed thereon. After some time, the layer of carbon polymer 154 prevents removal of additional tin oxide 152.

Returning to FIG. TA, at operation 103 a gas flush is performed to remove the $H_2$ and $CH_4$ from the chamber and from the delivery lines feeding the chamber. The gas flush may be accomplished by flowing one or more inert gas into the chamber, thereby flushing the relevant chemistry from the chamber. Alternatively or in addition, the chamber may be evacuated using a vacuum connection to remove the relevant chemistry from the chamber. Next, at operation 105 the chamber surface 150 is exposed to plasma generated from oxygen ($O_2$), which reacts with and removes the carbon polymer 154, as shown in FIG. 1B. At this point, the tin oxide 152 is thinner than it was at the beginning of the method.

At operation 107 it is determined whether there is additional tin oxide 152 to remove from the chamber surface 150. This determination may be made based on the time elapsed, the number of cycles elapsed, the thickness of material being removed, the thickness of material removed per cycle, etc. This determination may also be made based on metrology, for example based a measurement that provides information about the presence and/or thickness of material at a particular location within the chamber. In most cases, it takes several cycles (e.g., about 5-10 cycles) of the method shown in FIG. 1A to adequately remove the tin oxide 152 from the chamber surface 150.

If it is determined in operation 107 that there is additional tin oxide to remove, the method continues with operation 109, where a second gas flush is performed to remove $O_2$ from the chamber and the delivery lines feeding the chamber. The method then repeats, starting with operation 101. When it is determined in operation 107 that there is not additional tin oxide to remove, the method is complete.

Using the cleaning method described in relation to FIGS. 1A and 1B, it takes about 17 hours to remove about 2 μm of tin oxide 152 from the chamber surface 150. This long cleaning time is undesirable. One reason the cleaning time is so long is the gas flushes performed in operations 103 and 109. These gas flushes are used to avoid unwanted reactions between the $H_2$/$CH_4$ and the 02. Another reason the cleaning time is so long is because the buildup of carbon polymer 154 limits the amount of tin oxide 152 that can be removed during each cycle.

FIG. 2A is a flowchart describing an improved method for cleaning tin oxide from an interior surface of a processing chamber. The method of FIG. 2A is described with reference to FIG. 2B, which shows chamber surface 250 coated with tin oxide 252 over the course of cleaning. As described above, in many cases the tin oxide 252 has a thickness of about 2 μm on one or more chamber surface 250 before it is removed. The chamber surface may be aluminum (e.g., elemental aluminum), aluminum oxide (e.g., $AlO_3$), and/or a ceramic material. In various embodiments, the tin oxide may have a thickness of at least about 1 μm, at least about 2 μm, at least about 3 μm, at least about 4 μm, or at least about 5 μm before it is removed. In these or other embodiments, the tin oxide 252 may have a thickness of about 5 μm or less, for example about 4 μm or less, about 3 μm or less, or about 2.5 μm or less before it is removed. In various embodiments, the tin oxide accumulation/thickness is measured based on the cumulative thickness of tin oxide deposited on substrates in a particular processing chamber (e.g., rather than the thickness of tin oxide on a particular chamber surface). This cumulative thickness is measured from the time at which the processing chamber was most recently cleaned (e.g., to produce bare chamber surfaces). As such, in certain implementations the tin oxide thicknesses listed above may relate to the cumulative thickness of tin oxide deposited on substrates between chamber cleans.

The method of FIG. 2A begins with operation 201, where the chamber surface 250 with tin oxide 252 thereon is exposed to a first plasma generated from a first plasma generation gas that includes a first reducing chemistry and one or more optional inert gas. Example reducing chemistry can include one or more species from the group consisting of elemental hydrogen ($H_2$), hydrogen with or without a suitable catalyst such as a Lindlar catalyst, ammonia ($NH_3$), diborane ($B_2H_6$), sulfur dioxide ($SO_2$), sulfites (e.g., species containing $SO^{2-}_3$), iodides (e.g., species including $I^-$, one example of which is KI), hydrazine ($N_2H_4$), diisobutylaluminum hydride ($(i\text{-}Bu_2AlH)_2$), formic acid (HCOOH), phosphites (e.g., species including $(HPO_3)^{2-}$ or $(H_2PO_3)^-$), hypophosphites (e.g., species including $(H_2PO_2)^-$), phosphorus acid ($H_3PO_3$), carbon monoxide (CO), and cyanides (e.g., species including $CN^-$ or —CN). Example inert gases can include one or more species from the group consisting of helium (He), neon (Ne), argon (Ar), xenon (Xe), and elemental nitrogen ($N_2$). Notably, in many cases the first plasma is free of methane ($CH_4$) and other carbon-containing species, contrary to the cleaning method of FIG. 1A. However in some cases, a carbon-containing species may be included in the reducing chemistry, with particular examples listed above including, but not limited to, diisobutylaluminum hydride ($(i\text{-}Bu_2AlH)_2$), formic acid (HCOOH), carbon monoxide (CO), and cyanides (e.g., species including $CN^-$ or —CN). The first plasma operates to reduce the tin oxide 252 to form tin powder 253, as shown in FIG. 2B. Stannane ($SnH_4$) may also be formed from the tin oxide 252. The $SnH_4$ is relatively unstable and is typically converted to tin powder 253 or otherwise removed from the chamber surface 250 (e.g., in vapor form). Most or all of the tin powder 253 remains on the chamber surface 250 while the chamber surface 250 is exposed to the first plasma. In certain embodiments, the first plasma is generated from both reducing chemistry and an inert gas, as mentioned above. The inclusion of inert gas in the first plasma in operation 201 substantially increases the rate at which the tin oxide is reduced to tin powder, thereby minimizing the cleaning time. Further, the inclusion of inert gas in the first plasma reduces or eliminates temperature effects that otherwise result in non-uniform removal rates on chamber surfaces at different temperatures. These advantages are discussed further below.

Next, at operation 203, the chamber surface is exposed to a second plasma generated from a second plasma generation gas including both a second reducing chemistry and an organic additive chemistry, thereby removing the tin powder 253 from the chamber surface 250. The reducing chemistry may include one or more species from the group consisting of ammonia ($NH_3$) and hydrogen ($H_2$). The reducing chemistry in the second plasma generation gas may be the same or different from the reducing chemistry in the first plasma generation gas. In various embodiments, the organic additive chemistry may include at least one organic species selected from the group consisting of an alkane, an alcohol, a carboxylic acid, and an acetate. In a number of cases, the organic additive chemistry includes an organic species having a relatively short chain of carbon atoms. In many embodiments, the organic additive chemistry may have a chain of about 1 to about 6 carbon atoms. The chain may be branched or straight. In various cases, the alkane may have a formula of $C_nH_{2n+2}$. Example alkanes include, but are not limited to, methane ($CH_4$), ethane ($C_2H_6$), propane ($C_3H_8$), butane ($C_4H_{10}$), pentane ($C_5H_{12}$), hexane ($C_6H_{14}$), etc. The alcohol may have a formula of R—OH. Example alcohols include, but are not limited to, methanol ($CH_3OH$), ethanol ($C_2H_5OH$), propanol ($C_3H_7OH$), butanol ($C_4H_9OH$), pentanol ($C_5H_{11}OH$), hexanol ($C_6H_{13}OH$), etc. In some cases, a diol, triol, etc. may be used. The carboxylic acid may have a formula of R—COOH. Example carboxylic acids include, but are not limited to, methanoic acid (HCOOH), ethanoic acid ($CH_3COOH$), propanoic acid ($CH_3CH_2COOH$), butanoic acid ($CH_3(CH_2)_2COOH$), pentanoic acid ($CH_3(CH_2)_3COOH$), hexanoic acid ($CH_3(CH_2)_4COOH$), etc. In some cases where a carboxylic acid is used, the organic additive chemistry may include a dicarboxylic acid, a tricarboxylic acid, etc. The acetate may include an acetate anion ($CH_3CO_2^-$). The acetate may be provided as an acetate salt or an acetate ester in some embodiments.

At this point, the chamber surface 250 is clean, as shown in FIG. 2B.

The method of FIG. 2A has several advantages over the method of FIG. 1A. For example, because the first plasma in operation 201 is substantially free of $CH_4$ (and other carbon-containing species), no layer of carbon polymer is formed. Because the carbon polymer is not present, it is not able to limit the removal of tin oxide as explained in relation to FIGS. 1A and 1B. As such, there is no need for a cyclic process that gradually removes the tin oxide portion-by-portion. Instead, the entire layer of tin oxide can be converted to tin powder during a single exposure to the first plasma in operation 201.

A related advantage of the method of FIG. 2A is that there is no need to expose the chamber surface to $O_2$ plasma. Because the carbon polymer does not form, there is no need to remove it with $O_2$ plasma. As such, the $O_2$ plasma step can be completely eliminated.

Another advantage of the method of FIG. 2A is that there is no need to perform any gas flushes, as there is no risk of unwanted reactions between the different chemistries. By contrast, in the method of FIG. 1A, two gas flushes are needed during each cycle (e.g., operations 103 and 109) in order to prevent unwanted reactions between the $H_2/CH_4$ chemistry and the 02 chemistry. Eliminating the gas flushes allows the cleaning process to occur more quickly, as there is no need to wait for the relevant chemistry to be flushed out of the chamber and the delivery lines feeding the chamber.

The method of FIG. 2A can be used to substantially reduce the time required to clean the tin oxide from the chamber surfaces, as compared to the method of FIG. 1A. As mentioned above, the method of FIG. 1A typically requires about 17 hours to remove about 2 μm accumulation of tin oxide. In other words, the removal rate is limited to about 0.12 μm/hr, which is equivalent to about 2 nm/min. By contrast, when the method of FIG. 2A is used (e.g., without the optional inert gas), the same amount of tin oxide is removed in about half the time, for example about 8 hours. In this case, the removal rate is increased to about 0.25 μm/hr, which is equivalent to about 4 nm/min or about 40 Å/min. Further, when inert gas is added to the first plasma in operation 201, the duration of operation 201 can be further reduced by a factor of about 6. As such, when inert gas is added to the first plasma in operation 201, tin oxide having an accumulation/thickness of about 2 μm can be removed in about 2 hours. This includes both the time it takes to convert the tin oxide to tin powder in operation 201 and the time it takes to remove the tin powder in operation 203. This provides a tin oxide removal rate of about 1.0 μm/hr, which is equivalent to about 16 nm/min or about 160 Å/min. This high removal rate is not achievable using conventional cleaning methods. Further experimental results are presented below. In various embodiments, the tin oxide removal rate (including both operations 201 and 203) may be at least about 50 Å/min, for example at least about 100 Å/min, or at least about 120 Å/min, or at least about 150 Å/min.

One or more processing condition may be controlled in accordance with the example processing conditions provided herein. With reference to the method of FIG. 2A, the plasma generation conditions may be controlled during each of operations 201 and 203. Example conditions include the plasma generation frequency (or frequencies), plasma generation power at each frequency, plasma duty cycle, and the flow rate and composition of processing gas (or gases). In addition, the pressure within the processing chamber, as well as the temperature of various components/surfaces in the processing chamber, may be controlled.

During the first plasma step in operation 201, the first plasma may be generated at a frequency of about 400 kHz to about 40 MHz, using an RF power of about 400 W to about 4,000 W.

During operation 201, the first plasma is generated from a first plasma generation gas that includes at least reducing chemistry such as $H_2$ and/or $NH_3$. The first plasma generation gas may also include one or more inert gas to further increase the rate at which the tin oxide is converted to tin powder. The flow rate of reducing chemistry during operation 201 may be about 400 sccm to about 20,000 sccm, for example about 2,000 sccm to about 8,000 sccm. Where inert gas is provided during operation 201, it may have a flow rate of about 100 sccm to about 20,000 sccm, for example about 2,000 sccm to about 8,000 sccm.

Controlling the individual flow rates of the reducing chemistry and optional inert gas allows for control of the composition of the first plasma generation gas during operation 201. In one embodiment, the first plasma generation gas is free or substantially free of inert gas during operation 201. In such embodiments, the first plasma generation gas may be pure $H_2$, pure $NH_3$, or a combination of only $H_2$ and $NH_3$. In other embodiments, the first plasma generation gas includes one or more inert gas in addition to the reducing chemistry. In such cases, the first plasma generation gas may have a composition is at least about 5% inert gas, for example at least about 10%, or at least about 25%. In these or other embodiments, the first plasma generation gas may have a composition that is about 99% or less inert gas, for example about 95% or less, about 90% or less, about 75% or less, about 50% or less, about 25% or less, or about 10% or less. For instance, a first plasma generation gas that includes $H_2$ provided at 100 sccm and inert gas provided at 200 sccm is understood to be about 67% inert gas. The recited minimum and maximum concentrations of inert gas in the first plasma generation gas for operation 201 may be combined as desired for a particular embodiment. For example, in some embodiments the first plasma generation gas may be about 5% to about 50% inert gas. In various embodiments, the first plasma generation gas in operation 201 includes only the reducing chemistry and the optional inert gas. For instance, a first plasma generation gas having a composition of at least about 10% inert gas may also include about 90% or less reducing chemistry. In some other embodiments, one or more species in addition to the reducing chemistry and optional inert gas may be provided in the first plasma generation gas.

The pressure in the processing chamber may be controlled to about 0.5 Torr to about 10 Torr during operation 201. Reaction products other than the tin powder (e.g., gas phase reaction products) may be removed from the processing chamber using a vacuum connection. During cleaning, one or more components in the processing chamber (and/or components forming the processing chamber itself) may be temperature-controlled, e.g., using one or more heating and/or cooling components to achieve a desired temperature at a desired location. Example components that may be temperature controlled include, but are not limited to, the chamber walls, chamber floor, chamber ceiling, substrate support, showerhead, etc. In some cases, the temperature of one or more component may be controlled, for example to raise its temperature and/or to reduce a temperature differential between different portions of (and/or components within) the processing chamber. This temperature control may promote a more uniform rate of tin oxide removal, especially in cases where no inert gas is provided during operation 201. In other embodiments, the temperature of the components is not actively controlled during cleaning. In various embodiments, the processing chamber and/or one or more components therein may have a temperature of about 25° C. to about 430° C. during operation 201. Temperature effects are further discussed below in the Experimental section.

In some embodiments, the chamber surface being cleaned may be exposed to the first plasma in operation 201 for a duration of about 10 min to about 300 min. As explained above, inclusion of inert gas during operation 201 results in a substantially higher conversion rate of tin oxide to tin powder, thereby enabling shorter cleaning periods. Generally, thicker tin oxide deposits will take longer to convert to tin powder.

Various processing conditions can be controlled in a similar manner during operation 203 while the chamber surfaces are exposed to the second plasma. For instance, the second plasma may be generated at a frequency of about 400 kHz to about 40 MHz, using an RF power of about 400 W to about 4,000 W.

During operation 203, the second plasma is generated from a second plasma generation gas that includes at least reducing chemistry and additive chemistry. Example chemistries are provided above. The second plasma generation gas in operation 203 has a different composition than the first plasma generation gas in operation 201, at least because the organic additive chemistry (and all other carbon-containing species) is omitted in the first plasma generation gas of operation 201 but included in the second plasma generation gas of operation 203. The second plasma generation gas may also include one or more inert gas. The flow rate of the reducing chemistry during operation 203 may be of about 400 sccm to about 20,000 sccm, for example about 2,000 sccm to about 8,000 sccm. The flow rate of the organic additive chemistry during operation 203 may be about 10 sccm to about 10,000 sccm, for example about 400 sccm to about 6,000 sccm. Where inert gas is provided during operation 203, it may have a flow rate about 10 sccm to about 40,000 sccm, for example about 4,000 sccm to about 10,000 sccm.

Controlling the individual flow rates and identities of the reducing chemistry, the organic additive chemistry, and optional inert gas allows for control of the composition of the second plasma generation gas during operation 203. In one embodiment, the second plasma generation gas is free or substantially free of inert gas during operation 203. In some such embodiments, the second plasma generation gas may be entirely $H_2/CH_4$ (or another combination of the reducing chemistries and organic additive chemistries described herein). The ratio of reducing chemistry:organic additive chemistry (e.g., the ratio of $H_2$:$CH_4$ in one embodiment) in the plasma generation gas (as measured in sccm) may be controlled. For instance, a second plasma generation gas including $H_2$ at 200 sccm and $CH_4$ at 100 sccm has an $H_2$:$CH_4$ ratio of 2:1, which can be recited more simply as 2. In various embodiments, the ratio of reducing chemistry: organic additive chemistry in the second plasma generation gas may be controlled to about 0.01 to about 100 (e.g., about 1:100 to about 100:1), for example about 0.1 to about 50 (e.g., about 1:10 to about 50:1), or about 0.5 to about 20 (e.g., about 1:2 to about 20:1). Likewise, where inert gas is present in the second plasma generation gas during operation 203, the ratio of reducing gas:inert gas (e.g., $H_2$:inert gas in some embodiments) may be about 0.1 to about 10 (e.g., about 1:10 to about 10:1), and the ratio of organic additive chemistry:inert gas (e.g., $CH_4$:inert gas in some embodiments) may be about 0.02 to about 10 (e.g., about 1:50 to about 10:1).

In some embodiments, the chamber surface being cleaned may be exposed to the second plasma in operation 203 for a duration about 2 min to about 240 min. Generally, thicker tin oxide deposits will result in thicker layers of tin powder, which take relatively longer to remove.

During operation 203, the pressure within the processing chamber may be controlled as described above in relation to operation 201. In many cases, operations 201 and 203 occur at substantially the same pressure. However, in some cases, operation 203 may be performed at a pressure that is lower or higher than the pressure at which operation 201 is performed. Similarly, the temperature of the processing chamber (and/or one or more components therein) may be controlled during operation 203 in a similar manner as described in relation to operation 201. In some cases, the temperature of the processing chamber and the components therein is not actively controlled during either of operations 201 or 203. In other cases, the temperature of the processing chamber and/or one or more components therein may be controlled during at least one of operations 201 and 203. In some cases, temperature control is substantially the same in operations 201 and 203. In other cases, the temperature of one or more component may be controlled at a lower temperature during operation 201 and a higher temperature during operation 203, or vice versa.

Apparatus

The embodiments herein can be practiced on any suitable apparatus. A suitable apparatus typically includes at least one processing chamber in which semiconductor substrates are processed. Further, a suitable apparatus is equipped with or otherwise coupled to a plasma generator configured to provide plasma in the processing chamber. In many cases, the apparatus is used for depositing tin oxide on semiconductor substrates, though the embodiments are not so limited. Generally, the techniques herein can be used to remove tin oxide from any type of processing chamber, as long as appropriate chemistry/plasma can be provided.

Figure 3:
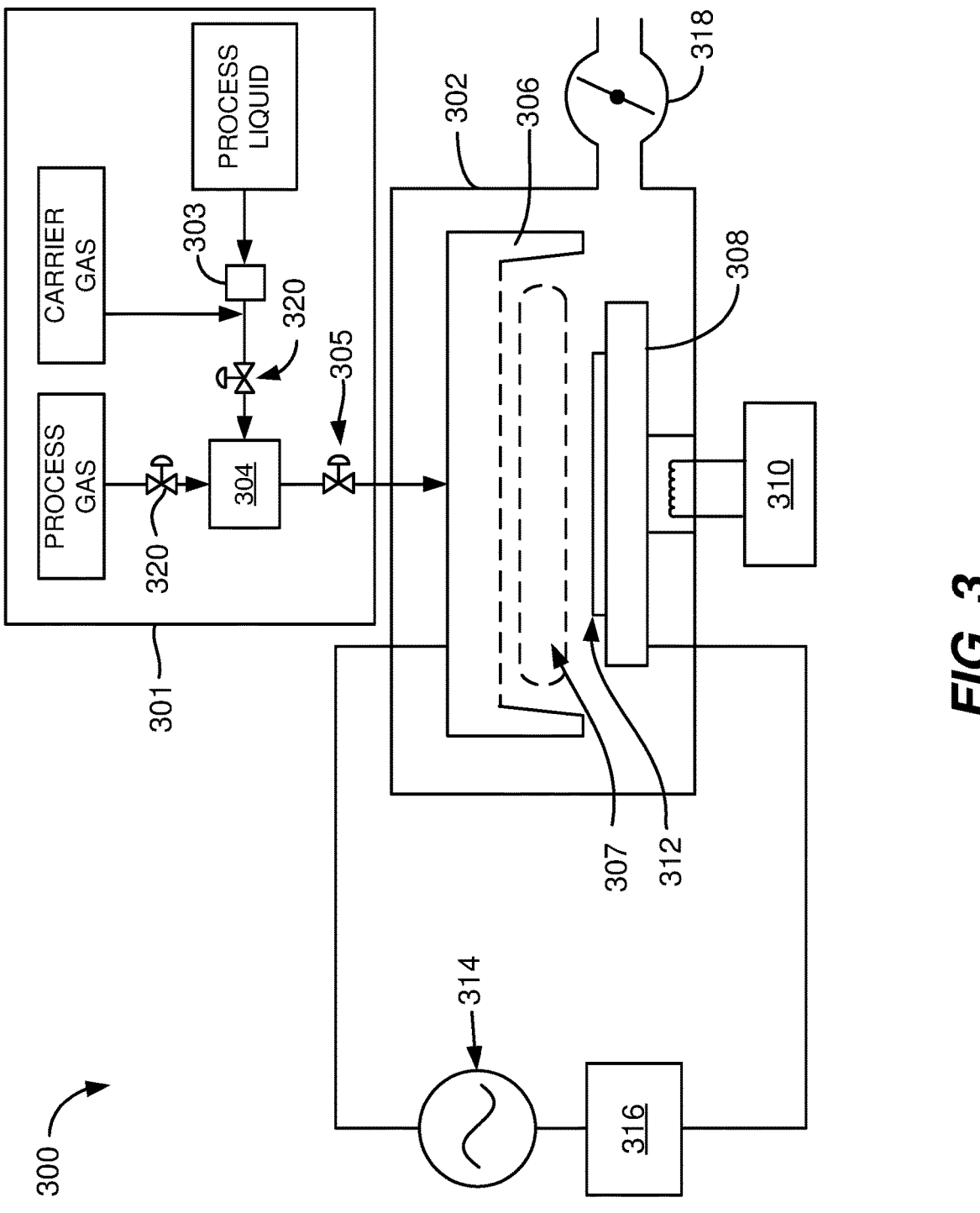
FIG. 3 illustrates a process station according to certain embodiments.

FIG. 3 schematically shows an embodiment of a process station 300 that may be used to deposit tin oxide and other materials using atomic layer deposition (ALD) and/or chemical vapor deposition (CVD), either of which may be plasma enhanced. For simplicity, the process station 300 is depicted as a standalone process station having a process chamber body 302 for maintaining a low-pressure environment. However, it will be appreciated that a plurality of process stations 300 may be included in a common process tool environment, as described in relation to FIGS. 4 and 5. Further, it will be appreciated that, in some embodiments, one or more hardware parameters of process station 300, including those discussed in detail below, may be adjusted programmatically by one or more computer controllers.

Process station 300 fluidly communicates with reactant delivery system 301 for delivering process gases to a distribution showerhead 306. Reactant delivery system 301 includes a mixing vessel 304 for blending and/or conditioning process gases for delivery to showerhead 306. One or more mixing vessel inlet valves 320 may control introduction of process gases to mixing vessel 304. Similarly, a showerhead inlet valve 305 may control introduction of process gasses to the showerhead 306. In some embodiments, the reactant delivery system may be modified to ensure that reactants do not mix before entering the process chamber body 302.

Some reactants may be stored in liquid form prior to vaporization at and subsequent delivery to the process station. For example, the embodiment of FIG. 3 includes a vaporization point 303 for vaporizing liquid reactant to be supplied to mixing vessel 304. In some embodiments, vaporization point 303 may be a heated vaporizer. The reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve sweeping and/or evacuating the delivery piping to remove residual reactant. However, sweeping the delivery piping may increase process station cycle time, degrading process station throughput. Thus, in some embodiments, delivery piping downstream of vaporization point 303 may be heat traced. In some examples, mixing vessel 304 may also be heat traced. In one non-limiting example, piping downstream of vaporization point 303 has an increasing temperature profile extending from approximately 100° C. to approximately 150° C. at mixing vessel 304.

In some embodiments, reactant liquid may be vaporized at a liquid injector. For example, a liquid injector may inject pulses of a liquid reactant into a carrier gas stream upstream of the mixing vessel. In one scenario, a liquid injector may vaporize reactant by flashing the liquid from a higher pressure to a lower pressure. In another scenario, a liquid injector may atomize the liquid into dispersed microdroplets that are subsequently vaporized in a heated delivery pipe. It will be appreciated that smaller droplets may vaporize faster than larger droplets, reducing a delay between liquid injection and complete vaporization. Faster vaporization may reduce a length of piping downstream from vaporization point 303. In one scenario, a liquid injector may be mounted directly to mixing vessel 304. In another scenario, a liquid injector may be mounted directly to showerhead 306.

In some embodiments, a liquid flow controller upstream of vaporization point 303 may be provided for controlling a mass flow of liquid for vaporization and delivery to process station 300. For example, the liquid flow controller (LFC) may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, the LFC may be dynamically switched from a feedback control mode to a direct control mode by disabling a sense tube of the LFC and the PID controller.

Showerhead 306 distributes process gases toward substrate 312. In the embodiment shown in FIG. 3, substrate 312 is located beneath showerhead 306, and is shown resting on a pedestal 308. It will be appreciated that showerhead 306 may have any suitable shape, and may have any suitable number and arrangement of ports for distributing processes gases to substrate 312. Showerhead 306 and associated reactant delivery system 301 also distributes process gases for cleaning surfaces of the process chamber body 302, for example using the techniques described herein to remove tin oxide.

In some embodiments, a microvolume 307 is located beneath showerhead 306. Performing an ALD and/or CVD process in a microvolume rather than in the entire volume of a process station may reduce reactant exposure and sweep times, may reduce times for altering process conditions (e.g., pressure, temperature, etc.), may limit an exposure of process station robotics to process gases, etc. Example microvolume sizes include, but are not limited to, volumes of about 0.1 liter to about 2 liters. This microvolume also impacts productivity throughput. While deposition rate per cycle drops, the cycle time also simultaneously reduces. In certain cases, the effect of the latter is dramatic enough to improve overall throughput of the module for a given target thickness of film.

In some embodiments, pedestal 308 may be raised or lowered to expose substrate 312 and/or a relevant processing chemistry to microvolume 307 and/or to vary a volume of microvolume 307. For example, in a substrate transfer phase, pedestal 308 may be lowered to allow substrate 312 to be loaded onto pedestal 308. During a deposition process phase, pedestal 308 may be raised to position substrate 312 within microvolume 307. In some embodiments, microvolume 307 may completely enclose substrate 312 as well as a portion of pedestal 308 to create a region of high flow impedance during a deposition process.

Optionally, pedestal 308 may be lowered and/or raised during portions the deposition process to modulate process pressure, reactant concentration, etc., within microvolume 307. Similar adjustments may be made during a cleaning process. In one scenario where process chamber body 302 remains at a base pressure during processing, lowering pedestal 308 may allow microvolume 307 to be evacuated. Example ratios of microvolume to process chamber volume include, but are not limited to, volume ratios of about 1:300 to about 1:10. It will be appreciated that, in some embodiments, pedestal height may be adjusted programmatically by a suitable computer controller.

In another scenario, adjusting a height of pedestal 308 may allow a plasma density to be varied during plasma activation and/or treatment cycles included in the deposition or cleaning process. At the conclusion of the deposition process phase, pedestal 308 may be lowered during another substrate transfer phase to allow removal of substrate 312 from pedestal 308. Cleaning typically takes place while no substrate is in the process chamber body 302.

While the example microvolume variations described herein refer to a height-adjustable pedestal, it will be appreciated that, in some embodiments, a position of showerhead 306 may be adjusted relative to pedestal 308 to vary a volume of microvolume 307. Further, it will be appreciated that a vertical position of pedestal 308 and/or showerhead 306 may be varied by any suitable mechanism within the scope of the present disclosure. In some embodiments, pedestal 308 may include a rotational axis for rotating an orientation of substrate 312. It will be appreciated that, in some embodiments, one or more of these example adjustments may be performed programmatically by one or more suitable computer controllers.

Returning to the embodiment shown in FIG. 3, showerhead 306 and pedestal 308 electrically communicate with RF power supply 314 and matching network 316 for powering a plasma. In some embodiments, the plasma energy may be controlled by controlling one or more of a process station pressure, a gas concentration, an RF source power, an RF source frequency, and a plasma power pulse timing. For example, RF power supply 314 and matching network 316 may be operated at any suitable power to form a plasma having a desired composition of radical species. Examples of suitable powers are included above. Likewise, RF power supply 314 may provide RF power of any suitable frequency. In some embodiments, RF power supply 314 may be configured to control high- and low-frequency RF power sources independently of one another. Example low-frequency RF frequencies may include, but are not limited to, frequencies of about 50 kHz to about 300 kHz. Example high-frequency RF frequencies may include, but are not limited to, frequencies of about 1.8 MHz to about 2.45 GHz. It will be appreciated that any suitable parameters may be modulated discretely or continuously to provide plasma energy for the desired reactions. In one non-limiting example, the plasma power may be intermittently pulsed to reduce ion bombardment on relevant surfaces relative to continuously powered plasmas.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, the plasma may be controlled via input/output control (IOC) sequencing instructions. In one example, the instructions for setting plasma conditions for a plasma process phase may be included in a corresponding plasma activation recipe phase of a deposition process recipe and/or a cleaning process recipe. In some cases, process recipe phases may be sequentially arranged, so that all instructions for a particular process phase are executed concurrently with that process phase. In some embodiments, instructions for setting one or more plasma parameters may be included in a recipe phase preceding a plasma process phase. For example, a first recipe phase may include instructions for setting a flow rate of an inert and/or a reactant gas, instructions for setting a plasma generator to a power set point, and time delay instructions for the first recipe phase. A second, subsequent recipe phase may include instructions for enabling the plasma generator and time delay instructions for the second recipe phase. A third recipe phase may include instructions for disabling the plasma generator and time delay instructions for the third recipe phase. It will be appreciated that these recipe phases may be further subdivided and/or iterated in any suitable way within the scope of the present disclosure.

In some plasma processes, plasma strikes last on the order of a few seconds or more in duration. In certain implementations, much shorter plasma strikes may be used (e.g., these may be particularly useful during deposition on substrates). These may be on the order of 10 ms to 1 second, typically, about 20 to 80 ms, with 50 ms being a specific example. Such very short RF plasma strikes require extremely quick stabilization of the plasma. To accomplish this, the plasma generator may be configured such that the impedance match is set preset to a particular voltage, while the frequency is allowed to float. Conventionally, high-frequency plasmas are generated at an RF frequency at about 13.56 MHz. In various embodiments disclosed herein, the frequency is allowed to float to a value that is different from this standard value. By permitting the frequency to float while fixing the impedance match to a predetermined voltage, the plasma can stabilize much more quickly, a result which may be important when using the very short plasma strikes associated with some types of deposition cycles.

In some embodiments, pedestal 308 may be temperature controlled via heater 310. Further, in some embodiments, pressure control for deposition process station 300 may be provided by butterfly valve 318. As shown in the embodiment of FIG. 3, butterfly valve 318 throttles a vacuum provided by a downstream vacuum pump (not shown). However, in some embodiments, pressure control of process station 300 may also be adjusted by varying a flow rate of one or more gases introduced to process station 300. Suitable controllers are discussed further below.

Figure 4:
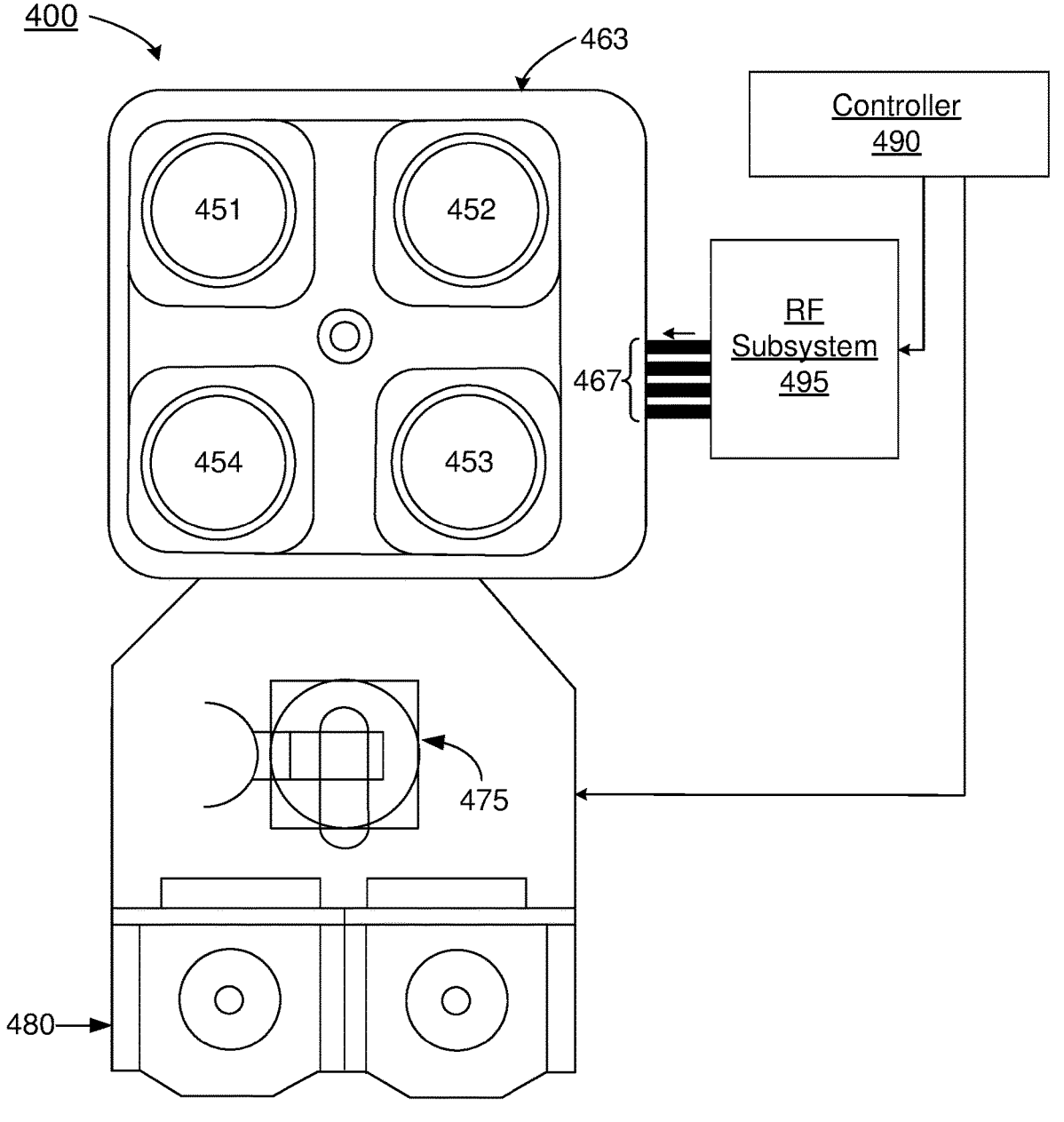
FIGS. 4 and 5 depict multi-station processing apparatus according to certain embodiments.

It may be appreciated that a plurality of process stations may be included in a multi-station processing tool environment, such as shown in FIG. 4, which depicts a schematic view of an embodiment of a multi-station processing tool. Processing apparatus 400 employs an integrated circuit fabrication chamber 463 that includes multiple fabrication process stations, each of which may be used to perform processing operations on a substrate held in a wafer holder, such as a pedestal, at a particular process station. In the embodiment of FIG. 4, the integrated circuit fabrication chamber 463 is shown having four process stations 451, 452, 453, and 454. Other similar multi-station processing apparatuses may have more or fewer process stations depending on the implementation and, for example, a desired level of parallel wafer processing, size/space constraints, cost constraints, etc. Also shown in FIG. 4 is substrate handler robot 475, which may operate under the control of system controller 490, configured to move substrates from a wafer cassette (not shown in FIG. 4) from loading port 480 and into integrated circuit fabrication chamber 463, and onto one of process stations 451, 452, 453, and 454.

FIG. 4 also depicts an embodiment of a system controller 490 employed to control process conditions and hardware states of processing apparatus 400. System controller 490 may include one or more memory devices, one or more mass storage devices, and one or more processors, as described herein.

RF subsystem 495 may generate and convey RF power to integrated circuit fabrication chamber 463 via radio frequency input ports 467. In particular embodiments, integrated circuit fabrication chamber 463 may comprise input ports in addition to radio frequency input ports 467 (additional input ports not shown in FIG. 4). Accordingly, integrated circuit fabrication chamber 463 may utilize 8 RF input ports. In particular embodiments, process stations 451-454 of integrated circuit fabrication chamber 165 may each utilize first and second input ports in which a first input port may convey a signal having a first frequency and in which a second input port may convey a signal having a second frequency. Use of dual frequencies may bring about enhanced plasma characteristics.

Figure 5:
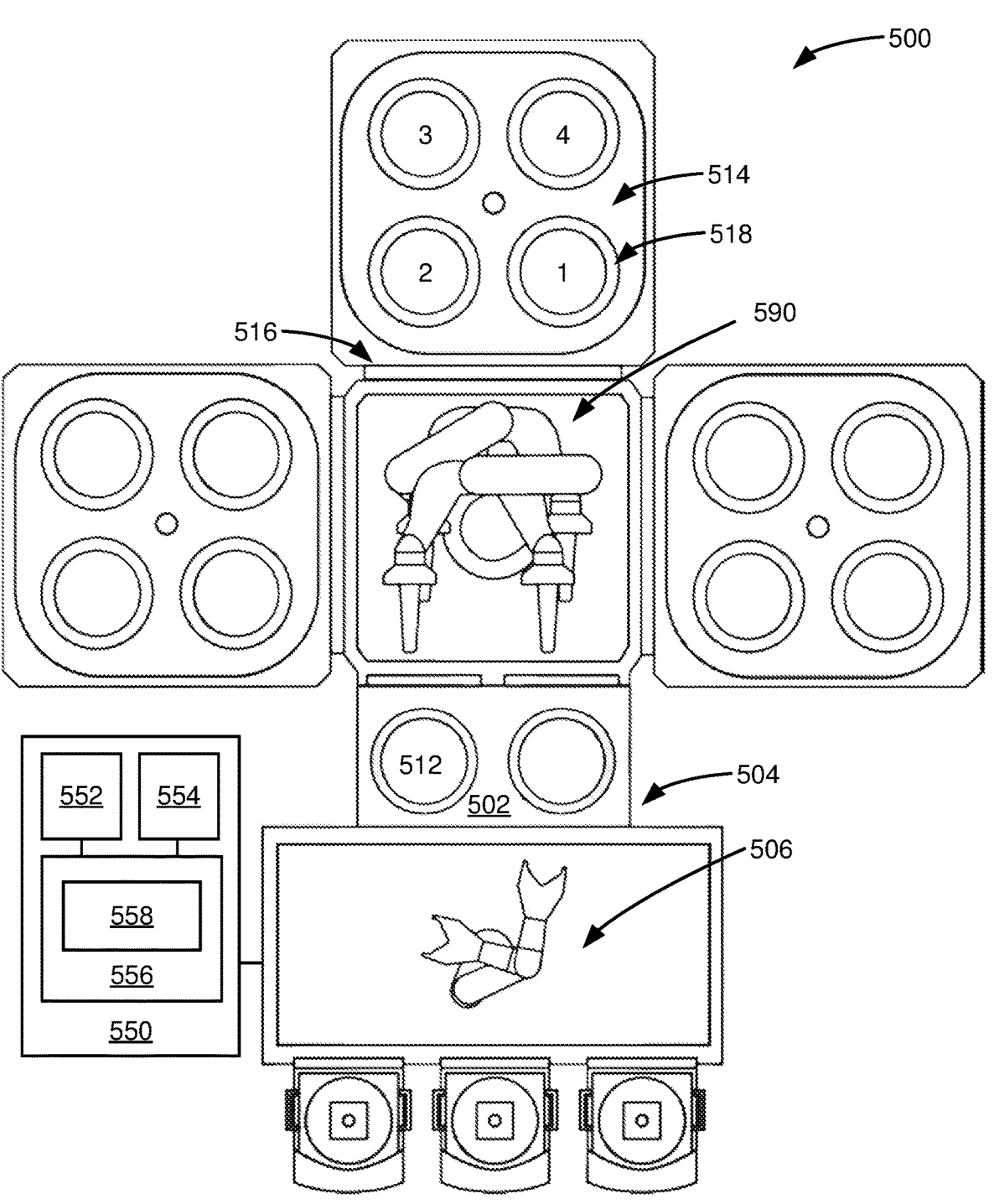

As described above, one or more process stations may be included in a multi-station processing tool. FIG. 5 shows a schematic view of an embodiment of a multi-station processing tool 500 with an inbound load lock 502 and an outbound load lock 504, either or both of which may comprise a remote plasma source. A robot 506, at atmospheric pressure, is configured to move substrates or wafers from a cassette loaded through a pod 508 into inbound load lock 502 via an atmospheric port 510. A substrate is placed by the robot 506 on a pedestal 512 in the inbound load lock 502, the atmospheric port 510 is closed, and the load lock is pumped down. Where the inbound load lock 502 comprises a remote plasma source, the substrate may be exposed to a remote plasma treatment in the load lock prior to being introduced into a processing chamber 514. Further, the substrate also may be heated in the inbound load lock 502 as well, for example, to remove moisture and adsorbed gases. Next, a chamber transport port 516 to processing chamber 514 is opened, and another robot (not shown) places the substrate into the reactor on a pedestal of a first station shown in the reactor for processing. While the embodiment depicted in FIG. 5 includes load locks, it will be appreciated that, in some embodiments, direct entry of a substrate into a process station may be provided. In various embodiments, the soak gas is introduced to the station when the substrate is placed by the robot 506 on the pedestal 512.

The depicted processing chamber 514 comprises four process stations, numbered from 1 to 4 in the embodiment shown in FIG. 5. Each station has a heated pedestal (shown at 518 for station 1), and gas line inlets. It will be appreciated that in some embodiments, each process station may have different or multiple purposes. For example, in some embodiments, a process station may be switchable between an ALD and PEALD process mode. Additionally or alternatively, in some embodiments, processing chamber 514 may include one or more matched pairs of ALD and plasma-enhanced ALD process stations. While the depicted processing chamber 514 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 5 depicts an embodiment of a wafer handling system 590 for transferring substrates within processing chamber 514. In some embodiments, wafer handling system 590 may transfer substrates between various process stations and/or between a process station and a load lock. It will be appreciated that any suitable wafer handling system may be employed. Non-limiting examples include wafer carousels and wafer handling robots. FIG. 5 also depicts an embodiment of a system controller 550 employed to control process conditions and hardware states of process tool 500. System controller 550 may include one or more memory devices 556, one or more mass storage devices 554, and one or more processors 552. Processor 552 may include a CPU or computer, analog and/or digital input/output connections, stepper motor controller boards, etc. In some embodiments, system controller 550 includes machine-readable instructions for performing operations such as those described herein.

In some embodiments, system controller 550 controls the activities of process tool 500. System controller 550 executes system control software 558 stored in mass storage device 554, loaded into memory device 556, and executed on processor 552. Alternatively, the control logic may be hard coded in the system controller 550. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 558 may include instructions for controlling the timing, mixture of gases, amount of gas flow, chamber and/or station pressure, chamber and/or station temperature, substrate temperature, target power levels, RF power levels, substrate pedestal, chuck and/or susceptor position, and other parameters of a particular process performed by process tool 500. System control software 558 may be configured in any suitable way. For example, various process tool component subroutines or control objects may be written to control operation of the process tool components used to carry out various process tool processes. System control software 558 may be coded in any suitable computer readable programming language.

In some implementations, the system controller 550 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 550, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings in some systems, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Experimental

Figure 6A:
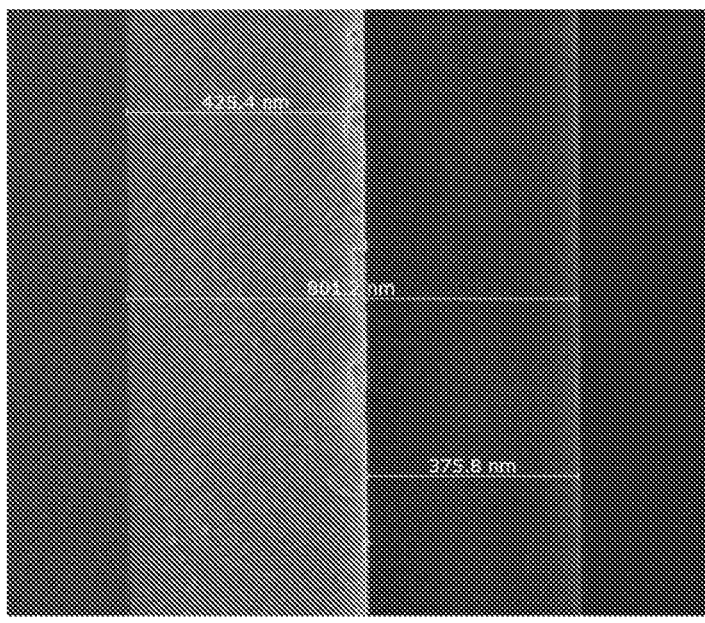
FIGS. 6A-6D show experimental results of different cleaning methods.

The techniques described herein can be used to substantially reduce the time required to remove tin oxide from interior surfaces of a processing chamber. FIGS. 6A-6D depict surfaces (e.g., metal surfaces analogous to the interior surfaces of a processing chamber) that were coated in tin oxide and cleaned according to different techniques described herein. FIG. 6A depicts a surface cleaned using plasma generated from $H_2/CH_4$, as described in the method of FIG. 1A. FIG. 6A shows the surface after a single exposure to the $H_2/CH_4$ plasma, and before exposure to the 02 plasma. The total cleaning time was about 50 minutes. In this example, the surface includes a substantial amount of unreacted tin oxide coated with a layer of carbon polymer. In order to make further progress cleaning the surface, the surface can be exposed to an oxygen plasma to remove the carbon polymer, as described in FIG. 1A.

Figure 6B:
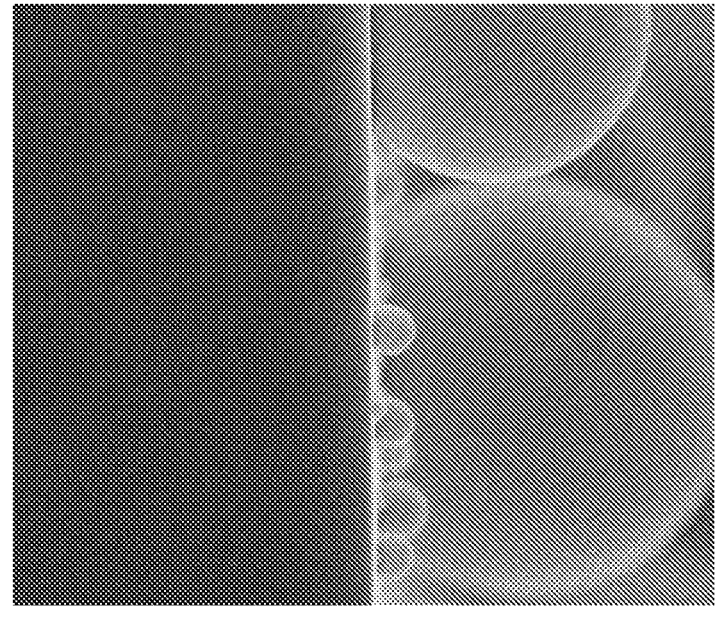

FIG. 6B depicts a surface cleaned by exposure to pure $H_2$ plasma. This illustrates the surface between operations 201 and 203 in the method of FIG. 2A. In this example, the surface was cleaned for a duration of about 10 minutes. FIG. 6B shows that the tin oxide has been converted to tin powder (e.g., the large circles illustrate the tin powder). Because a substantial amount of tin powder remains on the surface, the $H_2$ plasma step is not itself sufficient to produce a clean surface. Additional experimental results (not shown) confirm that even when the cleaning time is substantially extended, for example to about 70 minutes, the tin powder still remains on the surface.

Figure 6C:
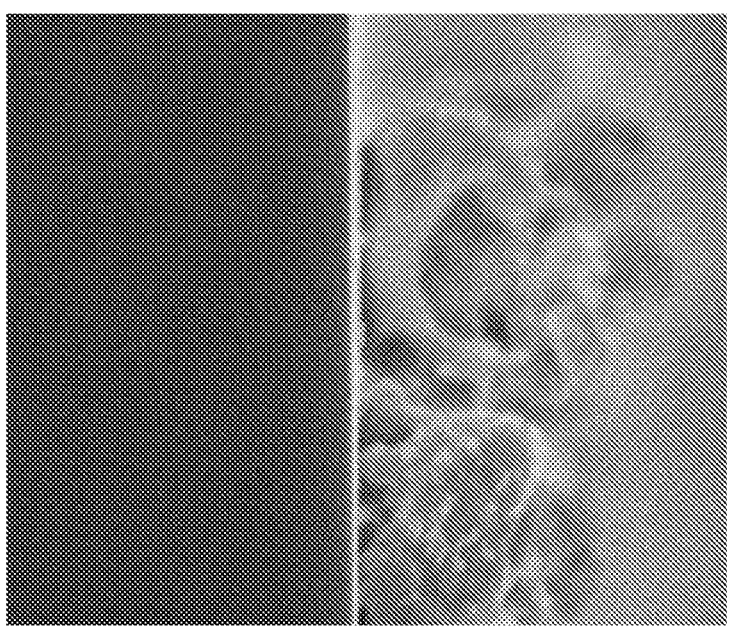

FIG. 6C shows a surface cleaned by exposure to plasma generated from a plasma generation gas including 5% $CH_4$ and 95% $H_2$. This example is similar to the one shown in FIG. 6A, except that the plasma generation gas used for FIG. 6C had a lower content of $CH_4$ compared to the plasma generation gas used for FIG. 6A. In the FIG. 6C example, there is substantial carbon polymer remaining on the surface after cleaning. The cleaning duration in FIG. 6C was about 70 minutes. These results confirm that the tin oxide is not successfully removed using a single plasma step, even when the plasma includes relatively low carbon content.

Figure 6D:
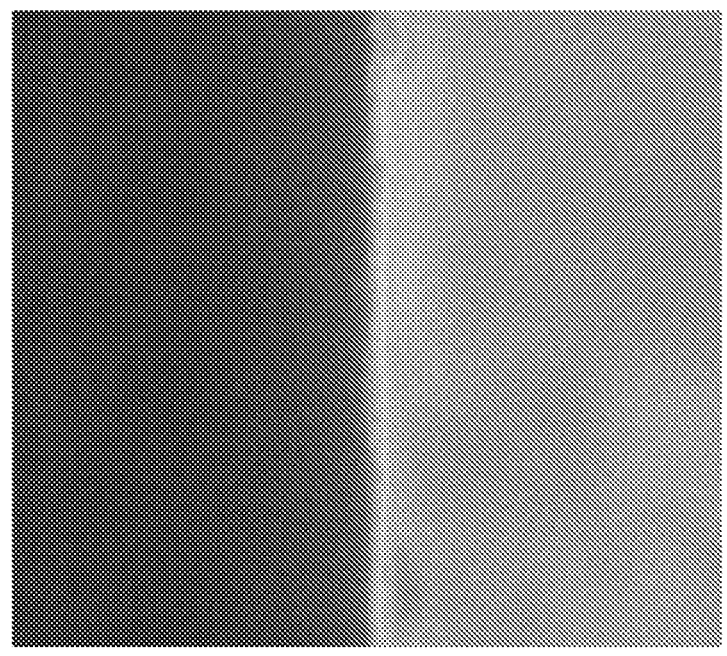

FIG. 6D shows a surface cleaned by exposure to a first plasma generated from $H_2$ followed by exposure to a second plasma generated from $H_2/CH_4$, as described in the method of FIG. 2A. The surface was exposed to the first plasma for a duration of about 10 minutes, and was exposed to the second plasma for a duration of about 40 minutes, for a total cleaning duration of about 50 minutes. The results in FIG. 6D illustrate a clean surface, without any tin oxide or tin powder remaining.

Figure 7:
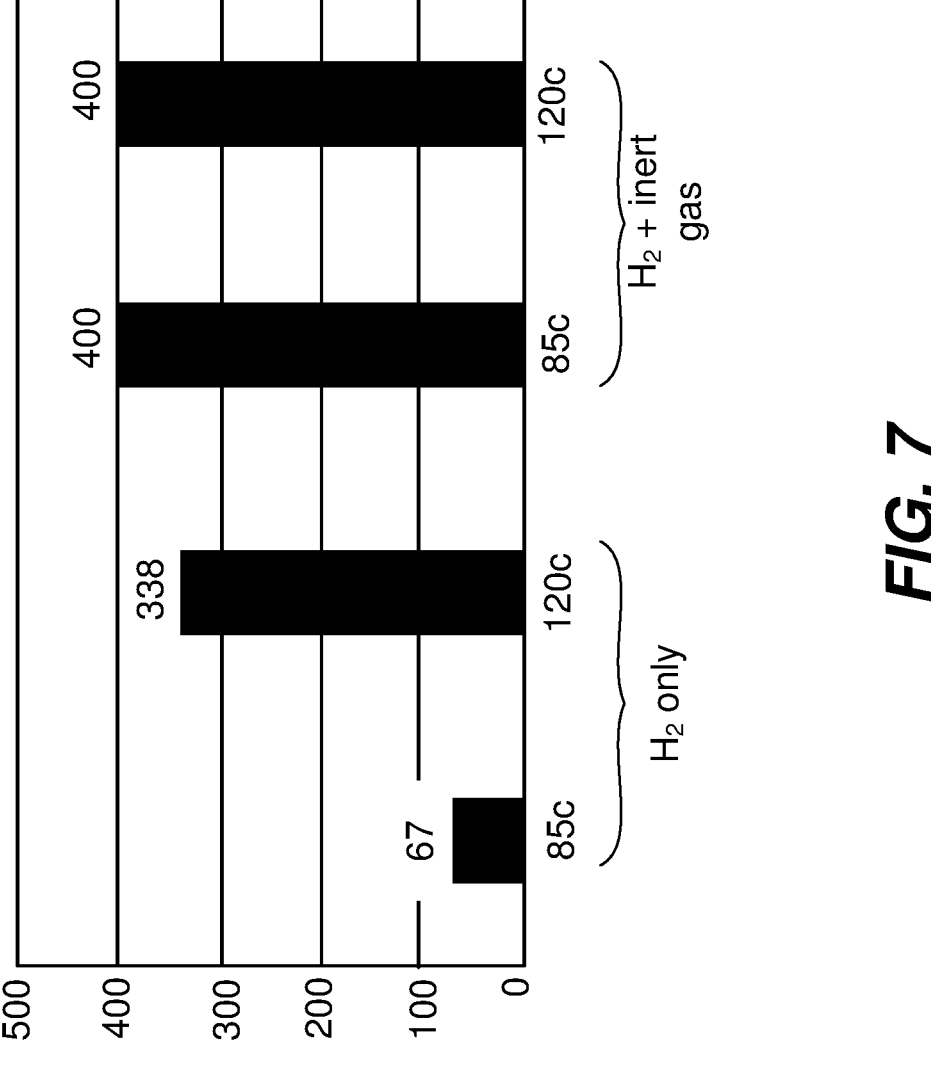
FIG. 7 shows experimental results related to conversion of tin oxide to tin powder at different temperatures using different cleaning methods.

FIG. 7 depicts experimental results showing the conversion rate of tin oxide to tin powder at different temperatures. With reference to the method of FIG. 2A, this is the conversion rate achieved during operation 201 while the substrate is exposed to first plasma (e.g., an $H_2$ plasma in this example). In cases where the first plasma is pure reducing chemistry, there is a substantial difference in conversion rate at different temperatures, with a lower conversion rate at lower temperature and a higher conversion rate at higher temperature. For instance, as shown in FIG. 7, the conversion rate at 85° C. is about 67 Å/min and the conversion rate at 120° C. is about 338 Å/min. This is a substantial difference, and may lead to non-uniform conversion rates at different portions of the processing chamber that are at different temperatures. Chamber surfaces are often at non-uniform temperatures during cleaning, with some portions of the chamber at lower temperatures and other portions of the chamber at higher temperatures.

As described above, one way to reduce the effect of temperature on the conversion rate is to include inert gas in the first plasma in operation 201. As shown in FIG. 7, when the first plasma includes inert gas (e.g., in this case the inert gas was helium), the conversion rate increases to about 400

Å/min at both 85° C. and 120° C. As such, the inclusion of inert gas in the first plasma promotes both a higher rate of conversion and a more uniform rate of conversion across different temperatures, as compared to pure reducing chemistry plasma (e.g., pure $H_2$ plasma). This allows for faster, more uniform cleaning results compared to cases where pure reducing chemistry plasma is used. Both options (e.g., pure reducing chemistry and reducing chemistry/inert gas) are considered to be within the scope of the disclosed embodiments.

In various embodiments, the conversion rate from tin oxide to tin powder is at least about 60 Å/min, for example at least about 100 Å/min, at least about 200 Å/min, at least about 300 Å/min, or at least about 400 Å/min. In these or other embodiments, the conversion rate may be substantially uniform at different portions of the chamber surface. For instance, the conversion rate may vary by no more than about 10% (in some cases no more than about 5% or no more than about 1%) at different portions of the chamber surface.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of cleaning a chamber surface to remove tin oxide therefrom, the method comprising:

exposing the chamber surface to a first plasma generated from a first plasma generation gas comprising a first reducing chemistry to reduce the tin oxide to tin; and exposing the chamber surface to a second plasma generated from a second plasma generation gas comprising a second reducing chemistry and organic additive chemistry to remove the tin from the chamber surface.

2. The method of claim 1, wherein the first plasma generation gas further comprises an inert gas.

3. The method of claim 2, wherein the inert gas comprises at least one gas selected from the group consisting of helium, neon, argon, xenon, and nitrogen ($N_2$).

4. The method of claim 1, wherein a ratio of reducing chemistry:organic additive chemistry in the second plasma generation gas is about 0.01 to about 100.

5. The method of claim 1, wherein at least one of the first reducing chemistry or the second reducing chemistry comprises at least one species selected from the group consisting of elemental hydrogen ($H_2$), ammonia ($NH_3$), diborane ($B_2H_6$), sulfur dioxide ($SO_2$), hydrazine ($N_2H_4$), diisobutylaluminum hydride (($i$-$Bu_2AlH)_2$), formic acid (HCOOH), carbon monoxide (CO), a sulfite, an iodide, a phosphite, a hypophosphite, and a cyanide.

6. The method of claim 1, wherein the organic additive chemistry comprises at least one species selected from the group consisting of an alkane, an alcohol, a carboxylic acid, and an acetate.

7. The method of claim 5, wherein the first plasma generation gas is substantially free of $CH_4$.

8. The method of claim 5, wherein the first plasma generation gas is substantially free of carbon-containing species.

9. The method of claim 1, wherein the first plasma and the second plasma are each capacitively coupled plasmas.

10. An apparatus for processing a substrate, the apparatus comprising:

a processing chamber having a chamber surface on an interior of the processing chamber;

an inlet to the processing chamber for introducing reactants to the processing chamber;

an outlet to the processing chamber for removing species from the processing chamber;

a plasma generator configured to provide plasma in the processing chamber; and a controller configured to cause:

exposing the chamber surface to a first plasma generated from a first plasma generation gas comprising a first reducing chemistry to reduce tin oxide on the chamber surface to tin, and exposing the chamber surface to a second plasma generated from a second plasma generation gas comprising a second reducing chemistry and an organic additive chemistry to remove the tin from the chamber surface.

\* \* \* \* \*